(12) United States Patent
Norman

(10) Patent No.: US 11,507,301 B2
(45) Date of Patent: Nov. 22, 2022

(54) MEMORY MODULE IMPLEMENTING MEMORY CENTRIC ARCHITECTURE

(71) Applicant: SUNRISE MEMORY CORPORATION, Fremont, CA (US)

(72) Inventor: Robert D. Norman, Pendleton, OR (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 6 days.

(21) Appl. No.: 17/176,860

(22) Filed: Feb. 16, 2021

(65) Prior Publication Data

US 2021/0263673 A1 Aug. 26, 2021

Related U.S. Application Data

(60) Provisional application No. 62/980,586, filed on Feb. 24, 2020, provisional application No. 62/980,600, filed on Feb. 24, 2020.

(51) Int. Cl.
*G06F 3/06* (2006.01)
(52) U.S. Cl.
CPC ............ *G06F 3/0655* (2013.01); *G06F 3/061* (2013.01); *G06F 3/0673* (2013.01)
(58) Field of Classification Search
CPC ....... G06F 3/0655; G06F 3/061; G06F 3/0673
USPC ........................................................ 711/154
See application file for complete search history.

(56) References Cited

U.S. PATENT DOCUMENTS

| | | |
|---|---|---|
| 4,213,139 A | 7/1980 | Rao |
| 4,984,153 A | 1/1991 | Kregness et al. |
| 5,388,246 A | 2/1995 | Kasai |
| 5,583,808 A | 12/1996 | Brahmbhatt |
| 5,646,886 A | 7/1997 | Brahmbhatt |
| 5,656,842 A | 8/1997 | Iwamatsu |
| 5,768,192 A | 6/1998 | Eitan |
| 5,789,776 A | 8/1998 | Lancaster et al. |
| 5,915,167 A | 6/1999 | Leedy |
| 6,040,605 A | 3/2000 | Sano et al. |
| 6,057,862 A | 5/2000 | Margulis |
| 6,107,133 A | 8/2000 | Furukawa et al. |
| 6,118,171 A | 9/2000 | Davies et al. |

(Continued)

FOREIGN PATENT DOCUMENTS

| | | |
|---|---|---|
| KR | 20120085591 A1 | 8/2012 |
| WO | 2018236937 A1 | 12/2018 |

OTHER PUBLICATIONS

"EP Extended Search Report EP168690149.3", dated Oct. 18, 2019.

(Continued)

*Primary Examiner* — Christopher B Shin

(57) ABSTRACT

A semiconductor memory module for shared memory access implements memory-centric structures using a quasi-volatile memory. In one embodiment, the memory module for shared memory access includes a memory cube providing high capacity memory coupled to multiple multi-port memories to support simultaneous memory access at multiple memory interfaces. In other embodiments, a memory module incorporates a processor to implement computational memory architecture. In some embodiments, a mini core memory system implements a memory architecture for providing direct and parallel memory access to a mini processor core array.

32 Claims, 27 Drawing Sheets

(56) References Cited

U.S. PATENT DOCUMENTS

| | | | |
|---|---|---|---|
| 6,130,838 | A | 10/2000 | Kim et al. |
| 6,434,053 | B1 | 8/2002 | Fujiwara |
| 6,580,124 | B1 | 6/2003 | Cleeves et al. |
| 6,744,094 | B2 | 6/2004 | Forbes |
| 6,774,458 | B2 | 8/2004 | Fricke et al. |
| 6,873,004 | B1 | 3/2005 | Han et al. |
| 6,881,994 | B2 | 4/2005 | Lee et al. |
| 6,946,703 | B2 | 9/2005 | Ryu et al. |
| 7,005,350 | B2 | 2/2006 | Walker et al. |
| 7,307,308 | B2 | 12/2007 | Lee |
| 7,489,002 | B2 | 2/2009 | Forbes et al. |
| 7,524,725 | B2 | 4/2009 | Chung |
| 7,612,411 | B2 | 11/2009 | Walker |
| 8,026,521 | B1 | 9/2011 | Or-Bach et al. |
| 8,139,418 | B2 | 3/2012 | Carman |
| 8,178,396 | B2 | 5/2012 | Sinha et al. |
| 8,630,114 | B2 | 1/2014 | Lue |
| 8,767,473 | B2 | 7/2014 | Shim et al. |
| 8,848,425 | B2 | 9/2014 | Schloss |
| 8,878,278 | B2 | 11/2014 | Alsmeier et al. |
| 9,190,293 | B2 | 11/2015 | Wang et al. |
| 9,202,694 | B2 | 12/2015 | Konevecki et al. |
| 9,230,985 | B1 | 1/2016 | Wu et al. |
| 9,412,752 | B1 | 8/2016 | Yeh et al. |
| 9,455,268 | B2 | 9/2016 | Oh et al. |
| 9,620,605 | B2 | 4/2017 | Liang et al. |
| 9,633,944 | B2 | 4/2017 | Kim |
| 9,748,172 | B2 | 8/2017 | Takaki |
| 9,799,761 | B2 | 10/2017 | Or-Bach et al. |
| 9,842,651 | B2 | 12/2017 | Harari |
| 9,892,800 | B2 | 2/2018 | Harari |
| 9,911,497 | B1 | 3/2018 | Harari |
| 10,074,667 | B1 | 9/2018 | Higashi |
| 10,096,364 | B2 | 10/2018 | Harari |
| 10,121,553 | B2 | 11/2018 | Harari |
| 10,249,370 | B2 | 4/2019 | Harari |
| 10,254,968 | B1 | 4/2019 | Gazit et al. |
| 10,283,493 | B1 | 5/2019 | Nishida |
| 10,373,956 | B2 | 8/2019 | Gupta et al. |
| 10,381,370 | B2 | 8/2019 | Shin et al. |
| 10,381,378 | B1 | 8/2019 | Harari |
| 10,395,737 | B2 | 8/2019 | Harari |
| 10,431,596 | B2 | 10/2019 | Herner et al. |
| 10,475,812 | B2 | 11/2019 | Harari |
| 10,622,377 | B2 | 4/2020 | Harari et al. |
| 10,692,874 | B2 | 6/2020 | Harari et al. |
| 2001/0030340 | A1 | 10/2001 | Fujiwara |
| 2001/0053092 | A1 | 12/2001 | Kosaka et al. |
| 2002/0028541 | A1 | 3/2002 | Lee et al. |
| 2002/0051378 | A1 | 5/2002 | Ohsawa |
| 2002/0193484 | A1 | 12/2002 | Albee |
| 2004/0214387 | A1 | 10/2004 | Madurawe et al. |
| 2004/0246807 | A1 | 12/2004 | Lee |
| 2004/0262681 | A1 | 12/2004 | Masuoka et al. |
| 2004/0262772 | A1 | 12/2004 | Ramanathan et al. |
| 2005/0128815 | A1 | 6/2005 | Ishikawa et al. |
| 2005/0280061 | A1 | 12/2005 | Lee |
| 2006/0080457 | A1 | 4/2006 | Hiramatsu et al. |
| 2006/0155921 | A1 | 7/2006 | Gorobets et al. |
| 2006/0212651 | A1 | 9/2006 | Ashmore |
| 2007/0192518 | A1 | 8/2007 | Rupanagunta et al. |
| 2007/0236979 | A1* | 10/2007 | Takashima ............ H01L 27/105 257/E21.664 |
| 2008/0022026 | A1 | 1/2008 | Yang et al. |
| 2008/0239812 | A1 | 10/2008 | Naofumi et al. |
| 2009/0057722 | A1 | 3/2009 | Masuoka et al. |
| 2009/0157946 | A1 | 6/2009 | Arya |
| 2009/0237996 | A1 | 9/2009 | Kirsch et al. |
| 2009/0279360 | A1 | 11/2009 | Peter et al. |
| 2009/0316487 | A1 | 12/2009 | Lee et al. |
| 2010/0124116 | A1 | 5/2010 | Takashi et al. |
| 2011/0115011 | A1 | 5/2011 | Masuoka et al. |
| 2011/0134705 | A1 | 6/2011 | Jones et al. |
| 2011/0208905 | A1 | 8/2011 | Shaeffer et al. |
| 2011/0298013 | A1 | 12/2011 | Hwang et al. |
| 2012/0182801 | A1 | 7/2012 | Lue |
| 2012/0243314 | A1 | 9/2012 | Takashi |
| 2012/0307568 | A1 | 12/2012 | Banna et al. |
| 2013/0256780 | A1 | 10/2013 | Kai et al. |
| 2014/0015036 | A1 | 1/2014 | Fursin et al. |
| 2014/0075135 | A1 | 3/2014 | Choi et al. |
| 2014/0117366 | A1 | 5/2014 | Saitoh |
| 2014/0151774 | A1 | 6/2014 | Rhie |
| 2014/0173017 | A1 | 6/2014 | Takagi et al. |
| 2014/0247674 | A1 | 9/2014 | Karda et al. |
| 2014/0328128 | A1 | 11/2014 | Louie et al. |
| 2014/0340952 | A1 | 11/2014 | Ramaswamy et al. |
| 2015/0155876 | A1 | 6/2015 | Jayasena et al. |
| 2015/0194440 | A1 | 7/2015 | Noh et al. |
| 2015/0220463 | A1 | 8/2015 | Fluman et al. |
| 2015/0249143 | A1 | 9/2015 | Sano |
| 2015/0372099 | A1 | 12/2015 | Chen et al. |
| 2016/0013156 | A1 | 1/2016 | Zhai et al. |
| 2016/0086970 | A1 | 3/2016 | Peng |
| 2016/0225860 | A1 | 8/2016 | Karda et al. |
| 2016/0314042 | A1 | 10/2016 | Plants |
| 2016/0321002 | A1 | 11/2016 | Jung et al. |
| 2017/0092370 | A1 | 3/2017 | Harari |
| 2017/0092371 | A1 | 3/2017 | Harari |
| 2017/0148517 | A1 | 5/2017 | Harari |
| 2017/0148810 | A1 | 5/2017 | Kai et al. |
| 2017/0358594 | A1 | 12/2017 | Lu et al. |
| 2018/0095127 | A1 | 4/2018 | Pappu et al. |
| 2018/0108416 | A1 | 4/2018 | Harari |
| 2018/0269229 | A1 | 9/2018 | Or-Bach et al. |
| 2018/0331042 | A1 | 11/2018 | Manusharow et al. |
| 2018/0366471 | A1 | 12/2018 | Harari et al. |
| 2018/0366485 | A1 | 12/2018 | Harari |
| 2018/0366489 | A1 | 12/2018 | Harari et al. |
| 2019/0006009 | A1 | 1/2019 | Harari |
| 2019/0019564 | A1 | 1/2019 | Li et al. |
| 2019/0067327 | A1 | 2/2019 | Herner et al. |
| 2019/0148286 | A1* | 5/2019 | Or-Bach ............ H01L 27/11529 257/315 |
| 2019/0157296 | A1 | 5/2019 | Harari et al. |
| 2019/0171391 | A1* | 6/2019 | Dubeyko .............. G06F 3/0659 |
| 2019/0180821 | A1 | 6/2019 | Harari |
| 2019/0206890 | A1 | 7/2019 | Harari et al. |
| 2019/0244971 | A1 | 8/2019 | Harari |
| 2019/0259769 | A1 | 8/2019 | Karda et al. |
| 2019/0303042 | A1 | 10/2019 | Kim et al. |
| 2019/0325964 | A1 | 10/2019 | Harari |
| 2019/0319044 | A1 | 11/2019 | Harari |
| 2019/0348424 | A1 | 11/2019 | Karda et al. |
| 2019/0355747 | A1 | 11/2019 | Herner et al. |
| 2019/0370117 | A1 | 12/2019 | Fruchtman et al. |
| 2020/0051990 | A1 | 2/2020 | Harari et al. |
| 2020/0098738 | A1 | 3/2020 | Herner et al. |
| 2020/0098779 | A1 | 3/2020 | Cernea et al. |
| 2020/0176468 | A1 | 6/2020 | Herner et al. |
| 2020/0194416 | A1* | 6/2020 | Or-Bach ............ H01L 27/11524 |
| 2020/0201718 | A1 | 6/2020 | Richter et al. |
| 2020/0243486 | A1 | 7/2020 | Quader et al. |
| 2020/0258897 | A1 | 8/2020 | Yan et al. |
| 2022/0043596 | A1* | 2/2022 | Madraswala ......... G06F 3/0679 |

OTHER PUBLICATIONS

"European Search Report, EP 16852238.1", dated Mar. 28, 2019.
"European Search Report, EP17844550.8", dated Aug. 12, 2020, 11 pages.
"Invitation to Pay Additional Fees (PCT/ISA/206), PCT/US2020/015710", dated Mar. 20, 2020, 2 pages.
"Notification of Reasons for Refusal, Japanese Patent Application 2018-527740", (English translation), dated Nov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2019/014319", dated Apr. 15, 2019.
"PCT Search Report and Written Opinion, PCT/US2019/052164", dated Feb. 27, 2020.

(56) References Cited

OTHER PUBLICATIONS

"PCT Search Report and Written Opinion, PCT/US2019/052446", dated Dec. 11, 2019.
"PCT Search Report and Written Opinion, PCT/US2020/015710", dated Jun. 9, 2020.
"PCT Search Report and Written Opinion, PCT/US2020/017494", dated Jul. 20, 2020, 13 pages.
Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.
Kim, N., et al., "Multi-layered Vertical gate NANO Flash Overcoming Stacking Limit for Terabit Density Storage", Symposium on VLSI Tech. Dig. of Technical Papers, 2009, pp. 188-189.
Lue, H.T., et al., "A Highly Scalable 8-Layer 3D Vertical-gate {VG} TFT NANO Flash Using Junction-Free Buried Channel BE-SONOS Device", Symposium on VLSI: Tech. Dig. Of Technical Papers, 2010, pp. 131-132.
Tanaka, T., et al., "A 768 GB 3b/cell 3D-Floaling-Gate NANO Flash Memory", Digest of Technical Papers, the 2016 EEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.
"PCT Search Report and Written Opinion, PCT/US2021/016964", dated Jun. 15, 2021, 19 pages.

* cited by examiner

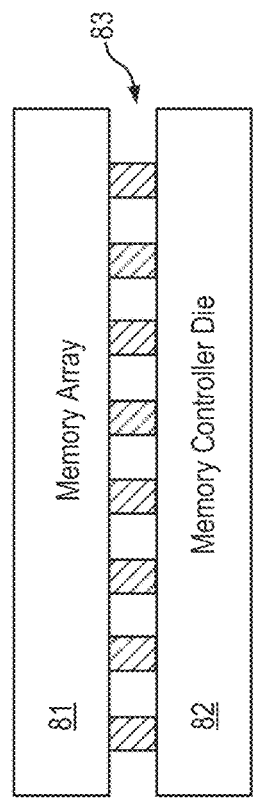
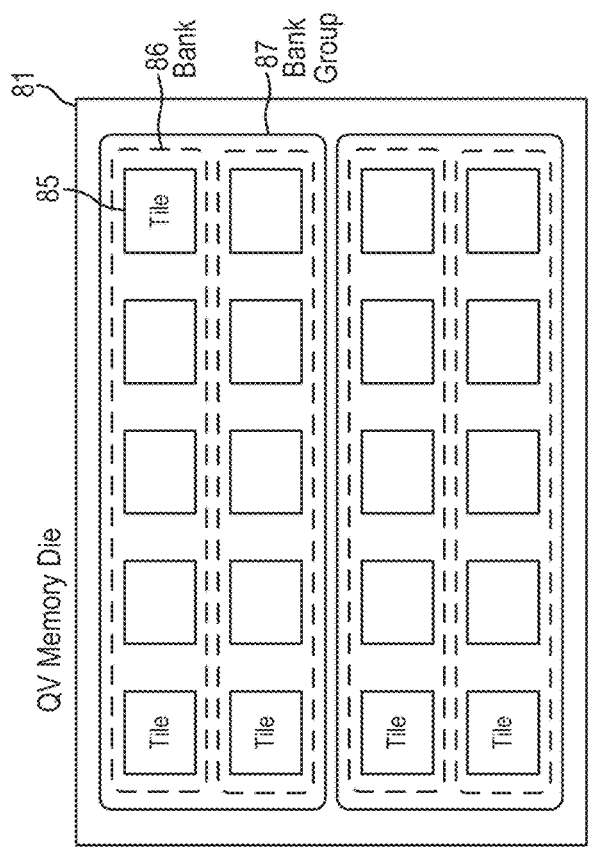
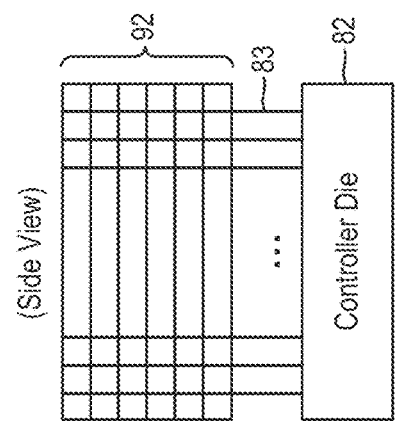
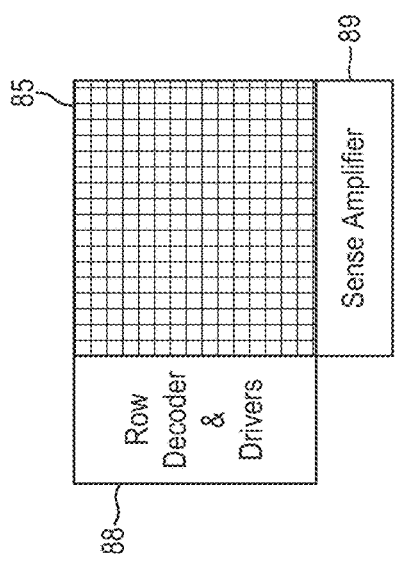
FIG. 6

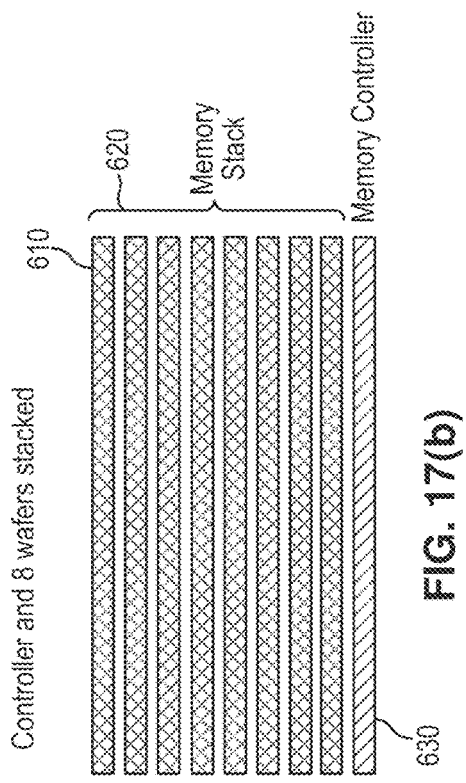
FIG. 17(b)
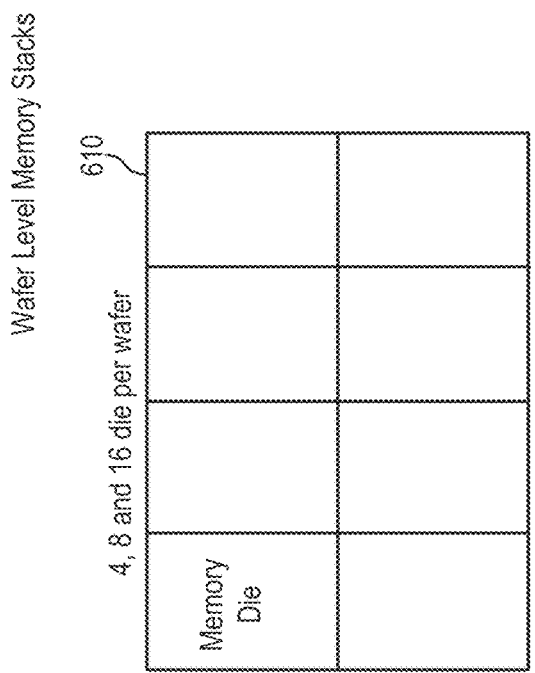
FIG. 17(a)
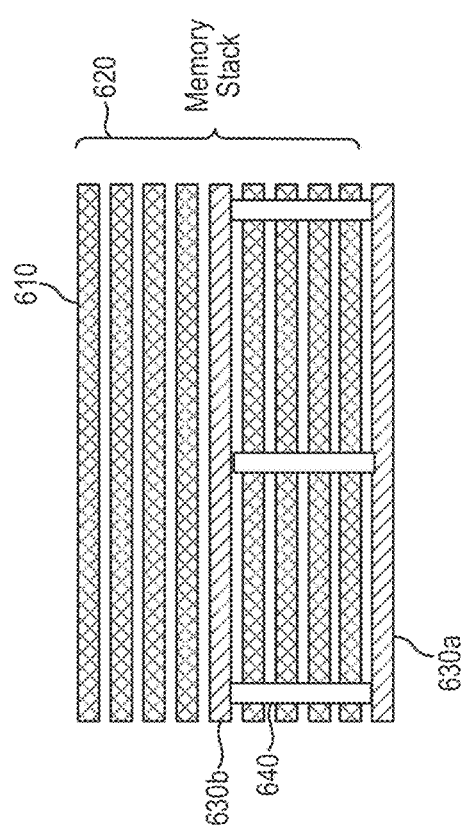
FIG. 17(c)
FIG. 17

MEMORY MODULE IMPLEMENTING
MEMORY CENTRIC ARCHITECTURE

CROSS REFERENCE TO RELATED
APPLICATIONS

This application claims priority to U.S. Provisional Patent Application No. 62/980,600, entitled "Memory Modules or Memory Centric Structures," filed on Feb. 24, 2020, which is incorporated herein by reference for all purposes. This application also claims priority to U.S. Provisional Patent Application No. 62/980,586, entitled "Wafer Level Memory," filed on Feb. 24, 2020, which is incorporated herein by reference for all purposes.

The present application is related to: (i) U.S. provisional patent application ("Provisional Application I"), Ser. No. 62/971,859, entitled "Quasi-volatile Memory System," filed on Feb. 7, 2020; (ii) U.S. provisional patent application ("Provisional Application II"), Ser. No. 62/980,596, entitled "Quasi-volatile Memory System-Level Memory," filed on Feb. 24, 2020; (iii) U.S. provisional patent application ("Provisional Application III"), Ser. No. 63/027,850, entitled "Quasi-volatile Memory System-Level Memory," filed on May 20, 2020, Provisional Applications I-III are now U.S. patent Application Ser. No. 17/169,212, filed Feb. 5, 2021; (iv) U.S. provisional patent application ("Provisional Application IV"), Ser. No. 62/971,720, entitled "High-Capacity Memory Circuit with Low Effective Latency," filed on Feb. 7, 2020, now U.S. patent Application Ser. No. 17/169,387, filed Feb. 5, 2021; and (v) U.S. provisional patent application ("Provisional Application V"), Ser. No. 62/980,571, entitled "Channel Controller For Shared Memory Access," filed on Feb. 24, 2020, now U.S. Patent Application Ser. No. 17/183,154, filed Feb. 23, 2021. Provisional Applications I-V (collectively, the "Provisional Applications") are hereby incorporated by reference in their entireties.

FIELD OF THE INVENTION

The present invention relates to semiconductor memories and their usage and technology. More specifically, the present invention relates to semiconductor memory integrated circuits implementing memory centric structures, and modules and systems incorporating the same.

BACKGROUND OF THE INVENTION

Conventional memory systems of different technology and architecture types are known. For example, a memory system may be built with components that are selected based on the requirements and the memory access patterns of a host computer, a telecommunication device, or another hardware and software (hereinafter, such a memory-accessing device is referred to as the "host," "host processor," or "host system"). In a conventional host system, a memory system may include different memory types, such as random-access memory (RAM), flash memory, read-only memory (ROM), and other suitable types of memory devices.

In the prior art, a RAM is typically a volatile memory device that stores the host's most frequently accessed data. A volatile memory loses its data when power is interrupted. Examples of RAMs include static RAM ("SRAM") and dynamic RAM ("DRAM"). A typical SRAM circuit is a single-bit flip-flop formed by cross-coupled transistors. A typical DRAM circuit includes an access transistor and a storage capacitor. To compensate for charge leakage from the capacitor, the DRAM circuit requires frequent refreshes to retain the stored data. Because a typical DRAM circuit has fewer components than a typical SRAM circuit, the DRAM circuit can achieve a higher data density than SRAM circuit; however, the typical SRAM circuit is faster and does not require refreshing.

Because of their cost and density advantages, DRAMs have been the dominate technology to service host systems, many of which are often referred to as "central processing units" ("CPUs"). As used herein, the term "CPU" refers to any logic circuit that manages and accesses a memory system, and thus includes such device as a graphics processing unit ("GPU"). Recently, DRAMs are seen to be reaching their limits, as it has become increasingly difficult for circuit density improvement (e.g., by reducing the physical dimensions of the storage capacitor). As the DRAM capacitor decreases in size, higher refresh rates are required, which increase power consumption. One impediment to changing refresh rates is the industry standards (e.g., the DDR standards promulgated by JEDEC) that compliant host systems must follow. Also, a higher refresh rate decreases the fraction of time available for memory access by the host, thereby adversely impacting performance. One approach for maintaining the conventional refresh rate is to refresh more units of memory in each refresh cycle, at the expense of power and heat dissipation. These conditions limit the current growth rate of DRAM density.

Thus, a long-felt need exists for a different memory type without the conventional power and density limitations. A novel type of memory—referred to as "quasi-volatile memory" ("QV memory")—is believed to have an effective performance rivalling DRAMs while having a much higher density. The QV memory is disclosed, for example, in U.S. Pat. No. 10,121,553 ("the '553 patent"), entitled "Capacitive-coupled Non-volatile Thin-film Transistor NOR Strings in Three-Dimensional Arrays," issued on Nov. 16, 2018. The '553 patent is incorporated herein by reference in its entirety. Like those of a non-volatile memory (NVM), the memory cells of a QV memory each store a data bit as an electric charge in a charge storage material (e.g., ONO). In one instance, a high-capacity QV memory is implemented by 3-dimensional arrays of NOR-type memory strings formed over a semiconductor substrate. Because of the nature of its charge-storage layer, a typical QV memory cell has a much longer data retention time than a DRAM cell and, hence, requires a lower refresh rate than the DRAM cell. For example, a typical DRAM system is designed to be refreshed every 78 microseconds; a QV memory with a comparable effective access performance, however, may be refreshed every 10 minutes. The reduced refresh rate provides the QV memory great advantages in a lower power requirement, a reduced heat dissipation, and a higher memory availability. The memory availability delivers a better host performance.

While a write operation in both an NVM and an QV memory requires a preceding erase step, the QV memory completes the task in a much shorter time (e.g., in the order of a tenth of a microsecond). Also, because the NVM typically carries out the erase operation simultaneously over a large block of memory cells, the erase operation typically requires management by a complex controller. Furthermore, because of its low wear-out, resulting from its generally lower-voltage operations, a typical QV memory cell has much higher endurance (e.g., $10^{12}$ erase-program cycles) than a typical NVM cell (e.g., $10^4$ erase-program cycles).

Host systems using memory technology may use various configurations. Some systems use non-uniform memory access (NUMA) where the memory is not shared and is specific to the computing environment. In other cases, better data sharing is need and a centralized memory with low latency and high throughput CPU attachments is used. One example of a memory shared among many processors is a HADOOP-style system in which each processor has its own memory but shares it over a network of clustered memory servers (e.g., over ethernet). HADOOP systems are widely used in "data analytics" (also known as "Big Data"), social media, and other large enterprise applications. Other systems may use clustered servers that run software to achieve parallel operations, and backup and recovery methods. Many such systems increase the size of their memory by adding accelerator boards to the processors. To enable data sharing, the accelerator boards communicate over a fast local-area network (LAN) to allow large file transfers, which are time-consuming and intensive in both power and bandwidth.

Social media and Big Data applications require performance that conventional system solutions are inadequate. A method for quickly transferring data from mass storage (e.g., flash memory) to RAM without the communication medium bottleneck (i.e., reduced latency and high through-put) is sometimes desired.

SUMMARY OF THE INVENTION

In some embodiments, a memory module includes one or more quasi-volatile memory circuits interconnected to at least one memory controller circuit, the memory module including multiple memory ports; and multiple multi-port memories coupled to the memory module at the memory ports, each multi-port memory being coupled to one memory port in the memory ports to exchange data with the memory module, each multi-port memory further including multiple memory interfaces for connecting to respective memory channels, where each multi-port memory includes one or more quasi-volatile memory circuits interconnected to at least one memory controller circuit.

In other embodiments, a memory device includes a high density memory module including an array of quasi-volatile memory modules, each quasi-volatile memory module including one or more quasi-volatile memory circuits interconnected to at least one memory controller circuit, the high density memory module further including multiple memory ports; and a channel controller coupled to the memory ports of the high density memory module to access the array of quasi-volatile memory modules.

In other embodiments, a mini processor core memory module includes a first semiconductor substrate comprising quasi-volatile memory circuits formed thereon, the quasi-volatile memory circuits being divided into memory partitions; and a second semiconductor substrate including a memory controller circuit to operate the quasi-volatile memory circuits as one or more quasi-volatile memories, SRAM circuits assoicated with each memory partitions, and an array of mini processor cores, the second semiconductor substrate being connected to the first semiconductor substrate, where the array of mini processor cores accesses the memory partitions of the quasi-volatile memory circuits in parallel.

In other embodiments, a computational memory module includes a first semiconductor substrate comprising quasi-volatile memory circuits formed thereon, the quasi-volatile memory circuits being divided into memory partitions; and a second semiconductor substrate comprising a memory controller circuit to operate the quasi-volatile memory circuits as one or more quasi-volatile memories, SRAM circuits assoicated with each memory partitions, a processor, a code memory, and a memory access circuit, the second semiconductor substrate being connected to the first semiconductor substrate, wherein the processor accesses the memory partitions of the quasi-volatile memory circuits using the memory access circuit to exchange data in response to executing processing tasks.

In some embodiments, a memory system for mini processor cores includes an array of mini processor cores; a quasi-volatile memory module coupled to the array of mini processor cores, wherein the mini processor cores in the array directly access the quasi-volatile memory module, the quasi-volatile memory module being accessible by the array of mini processor cores in parallel; and a processor in communication with the quasi-volatile memory module to manage data movement to the array of mini processor cores.

These and other advantages, aspects and novel features of the present disclosure, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the FIGS. are not necessarily to scale.

FIG. 6, which includes FIGS. 6(*a*), 6(*b*), 6(*c*) and 6(*d*), illustrates a QV memory module in examples of the present disclosure.

FIG. 17, which includes FIGS. 17(a), 17(b) and 17(c), illustrates various configuration for forming a wafer level memory stack in embodiments of the present disclosure.

FIG. 19(a), illustrates an application of the mini core-memory module as a computational memory in a memory centric computing system in examples of the present disclosure.

DETAILED DESCRIPTION

In embodiments of the present disclosure, a semiconductor memory module for shared memory access implements memory-centric structures using a quasi-volatile memory. Various configurations of the memory modules are described herein. In one embodiment, the memory module for shared memory access includes a memory cube providing high capacity memory coupled to multiple multi-port memories to support simultaneous memory access at multiple memory interfaces. In other embodiments, a memory module incorporates a processor to implement computational memory architecture. In some embodiments, a mini core memory system implements a memory architecture for providing direct and parallel memory access to a mini processor core array.

Figure 1:
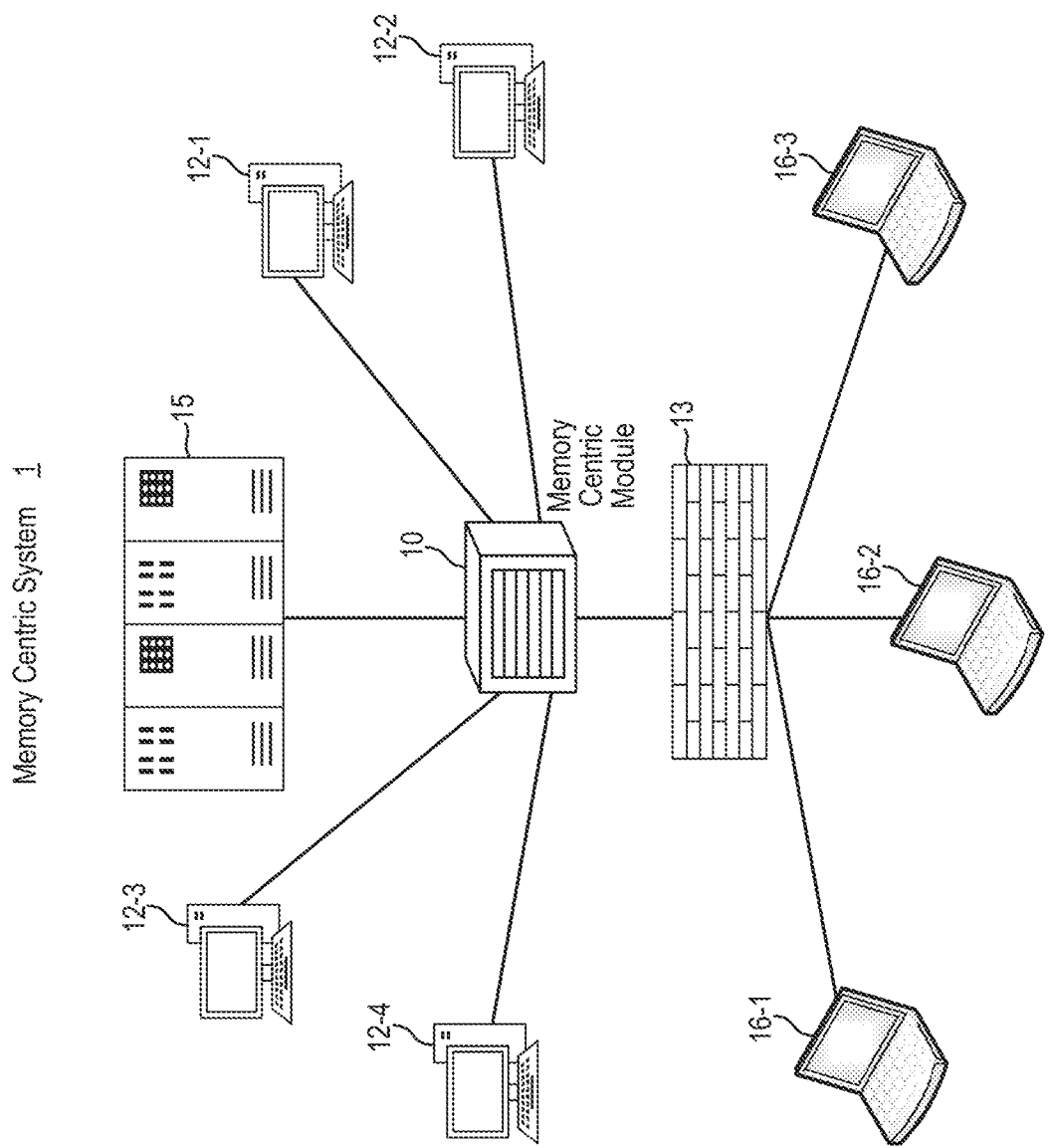
FIG. 1 illustrates a memory-centric computer system which allows parallel access of a shared memory by numerous processors in some examples.
Figure 2:
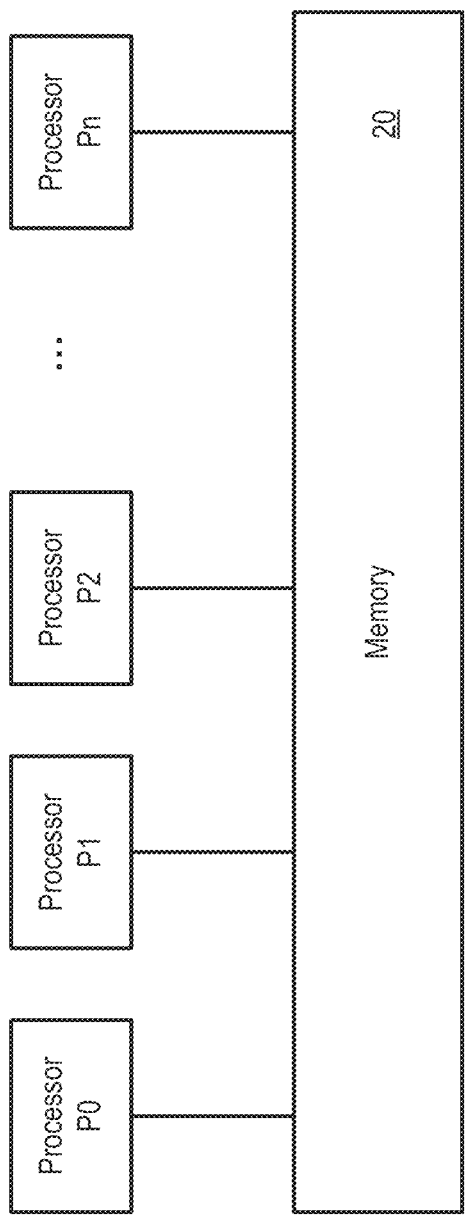
FIG. 2 illustrates another example of a memory-centric computer system.

Computer systems exist where a memory is shared among multiple processors. Memory sharing computer systems enable data sharing and parallel operations among the multiple processors. FIG. 1 illustrates a memory-centric computer system which allows parallel access of a shared memory by numerous processors in some examples. Referring to FIG. 1, in a memory-centric computer system 1, multiple processors are configured to access a shared memory 10, sometimes referred to as a memory centric memory module. The processors may include servers 12-1 to 12-4. The processors may also be part of a main frame computing system 15. Furthermore, the shared memory 10 may be access over a firewall 13 by mobile computing devices 16-1 to 16-3. The processors in the servers, the main frame computing system and the mobile computing devices each connect directly to the shared memory 10, such as over a processor bus, without using an intervening general-purpose switching network (e.g., switching network 303 of FIG. 3). Memory-centric computer system 1 thus avoids switch delays and optimizes memory sharing. FIG. 2 illustrates another example of a memory-centric computer system. Referring to FIG. 2, in a memory-centric computer system 21, a shared memory 20 is shared at the processor level where multiple processor cores P0 to Pn accesses the shared memory 20 in parallel.

FIGS. 1 and 2 illustrate memory sharing that can occur at the processor or CPU level with multiple processor cores accessing a shared memory. Memory sharing can also occur at the system level where multiple servers access a shared memory. Both configurations will need a different implementation at the controller level. Regardless of the particular memory sharing configuration, the functionality at the memory level maybe the same. For example, the memory sharing may be implemented by multipathing into a memory array giving simultaneous access at differing partitions of the shared memory. Memory partitioning can determine if usage meet the higher-level processing needs and modular expansion will be essential in a memory centric architecture to ensure successful implementation.

Figure 3:
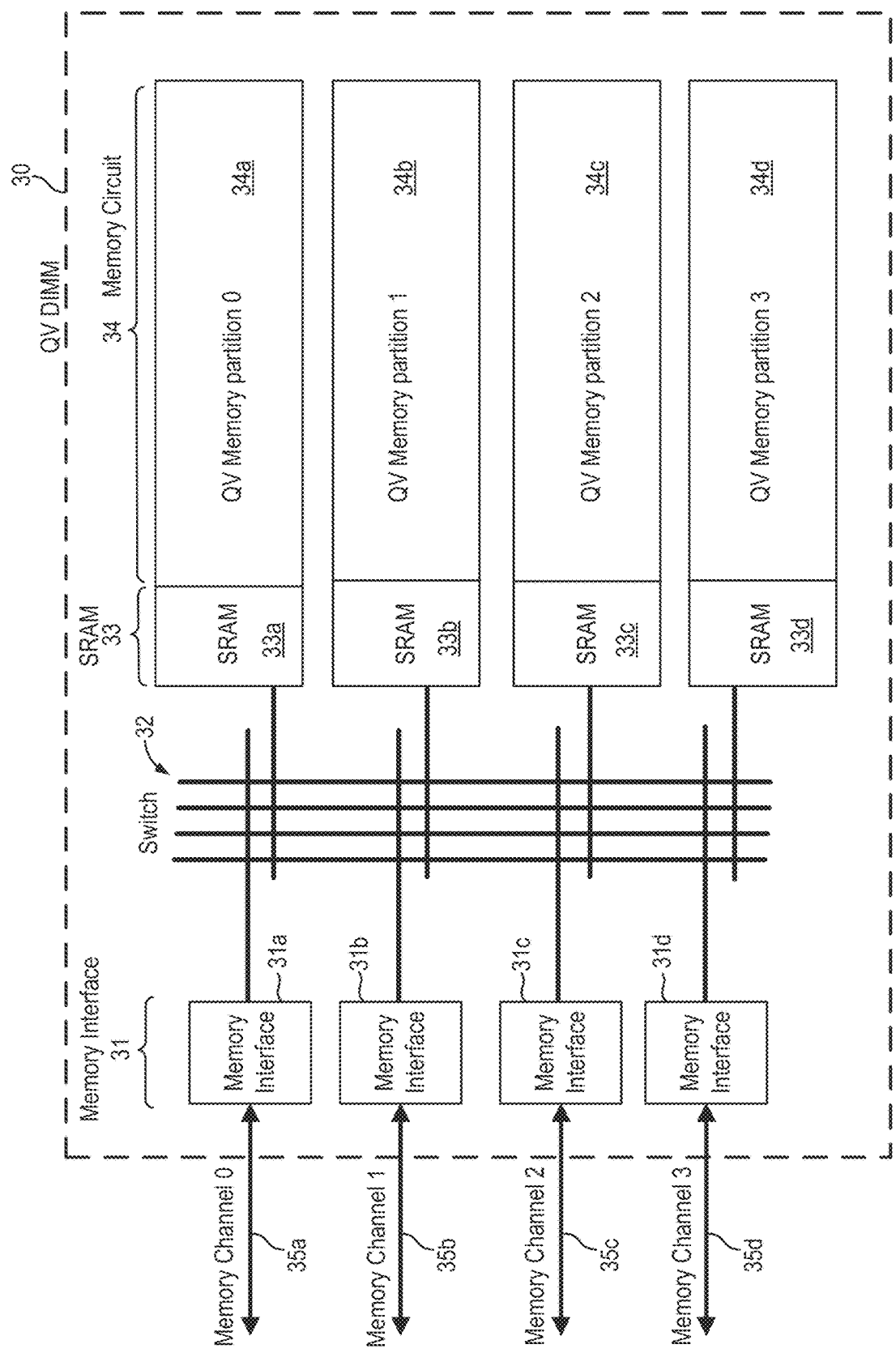
FIG. 3 illustrates a switched memory structure for shared memory access in some examples.

Methods for sharing a memory across CPUs through a switching matrix that allows multiple host channels to access the same memory block have been described, such as in Provisional Applications III and V. FIG. 3 illustrates a switched memory structure for shared memory access in some examples. Referring to FIG. 3, a QV DIMM 30 includes one or more QV memory modules forming a memory array 34. The memory array 34 may be partitioned into memory partitions 34a-34d of memory cells, each associated with SRAM 33a-33d. SRAM 33a-33d are optional and may be included to implement caching where desired. QV DIMM 30 further includes memory interfaces 31a-31d (also referred to "memory ports") controlling, respectively, memory channels 35a-35d. Switch matrix 32 may be configured such that any of memory partitions 34a-34d may be accessed over any of memory channels 35a-35d. Memory caching in SRAMs 33a-33d ensures that each memory partition performs as a high-capacity and low effective latency memory.

In some examples, QV DIMM 30 can also provide in-memory computation capabilities. For example, data sharing among memory channels 35a-35d may be achieved through the memory constituted from memory partitions 34a-34d within QV DIMM 30. RISC processors (not shown) in the QV memory modules within QV DIMM 30 may act as master for accessing, transferring or operating on data in their assigned portions of the QV memory. In one embodiment, each memory channel may be assigned to a portion of an address space that is mapped to specific portions of the memory partitions, allowing channel sharing of the QV memory and uniform memory access (UMA). When the QV memory is partitioned, with each partition accessible by multiple ports, higher performance may be expected, as the availability of multiple ports reduces access delays due to resource conflicts. In particular, memory partitioning and channel usage can be configured to build a shared memory with enough granularity to not cause excessive conflicts.

Figure 4:
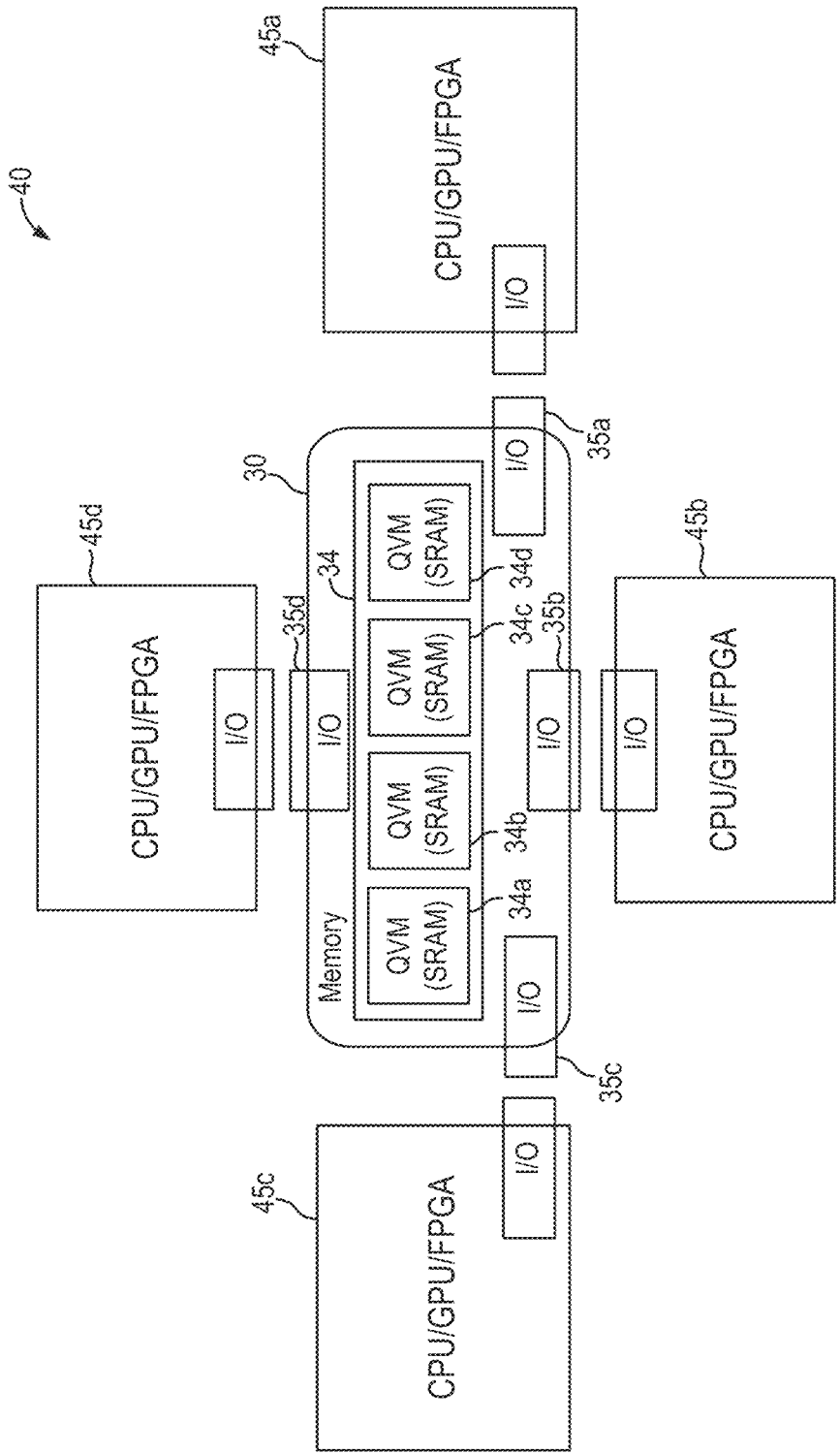
FIG. 4 illustrates system application of the switched memory of FIG. 3 in a computer system in some examples.

FIG. 4 illustrates system application of the switched memory of FIG. 3 in a computer system in some examples. In particular, the switched memory structure of FIG. 3 is applied in a computer system with different devices attached to each of the memory ports. Each memory port can be of a different type of port, enabling shared access to different type of shared devices. Referring to FIG. 4, a computer system 40 includes processors 45a to 45d coupled to memory channels 35a to 35d of a QV DIMM, such as QV DIMM 30 of FIG. 3. Processors 45a to 45d may each be any suitable computational device requiring access to the memory. For example, the processors 45a to 45d may be a CPU, a GPU or a reconfigurable processor (e.g., one constituted by field programmable gate arrays (FPGAs)). Each of memory channels 35a to 35d may be individually configured to support any suitable industry-standard memory interface (e.g., DDR4, DDR5 or HBM interface). In the configuration of FIG. 4, QV DIMM 30 may be partitioned such that each channel is dedicated a portion of the QV memory or, alternatively, one or more memory channels may share all or a portion of the QV memory. In a shared configuration, access to a memory block from one of the shared channels may be protected by a semaphore (e.g., implemented by a bit set in a configuration register), which blocks access to that memory block by another memory channel. The blocked memory channels may wait in a queue. Upon completion of access to the memory block, the semaphore is released. In other embodiments, an upstream controller may be allowed to arbitrate access conflict to give priority, according to some ordering scheme, set statically or dynamically. In the present example, each memory partition 34a-34d may include SRAM circuitry. Provisional Application III, incorporated by reference above, discloses various ways such SRAM circuitry may be used. For example, the SRAM circuitry may accelerate memory operation by acting as buffer memory, cache memory or another suitable manner for the associated memory partition, or as cache memory for the associated memory partition.

The QV DIMM approach of FIGS. 3 and 4 enables a system in which significant computational tasks may be carried out on the memory side of the memory interface. This is sometimes referred to as "memory-centric computing." Memory-centric computing avoids latency resulting from waiting for data to be read out of the memory. This approach has significant advantage over the approach in which logic circuits access data using multiple levels of cache that are accessed using register-to-register transfers carried out over short distances (thereby, reducing resistive capacitance delay). The switched memory structures of FIGS. 3 and 4 achieve memory-centric computing by providing a high-capacity memory. For example, the QV memory may be constructed using a memory die with tens to hundreds of gigabytes of memory cells, with the memory cells accessible in logical blocks that are much larger than the 8-bit or 128-bit word widths in DRAM and HBM, respectively, as specified by the JEDEC Solid State Technology Association. Within the QV DIMM, each QV memory module has one or more memory dies with memory circuits organized as tiles each allowing 1024 or more bits of readout per memory transaction. The QV memory module may be organized as a multi-port memory. In a multiport memory, the memory is partitioned into memory blocks that are each accessible from one or more dedicated ports. With a well-tuned size of partition and a suitable number of ports, such an organization allows the many memory blocks of a large memory to be accessed in parallel, with reduced likelihood of conflicts.

Figure 5:
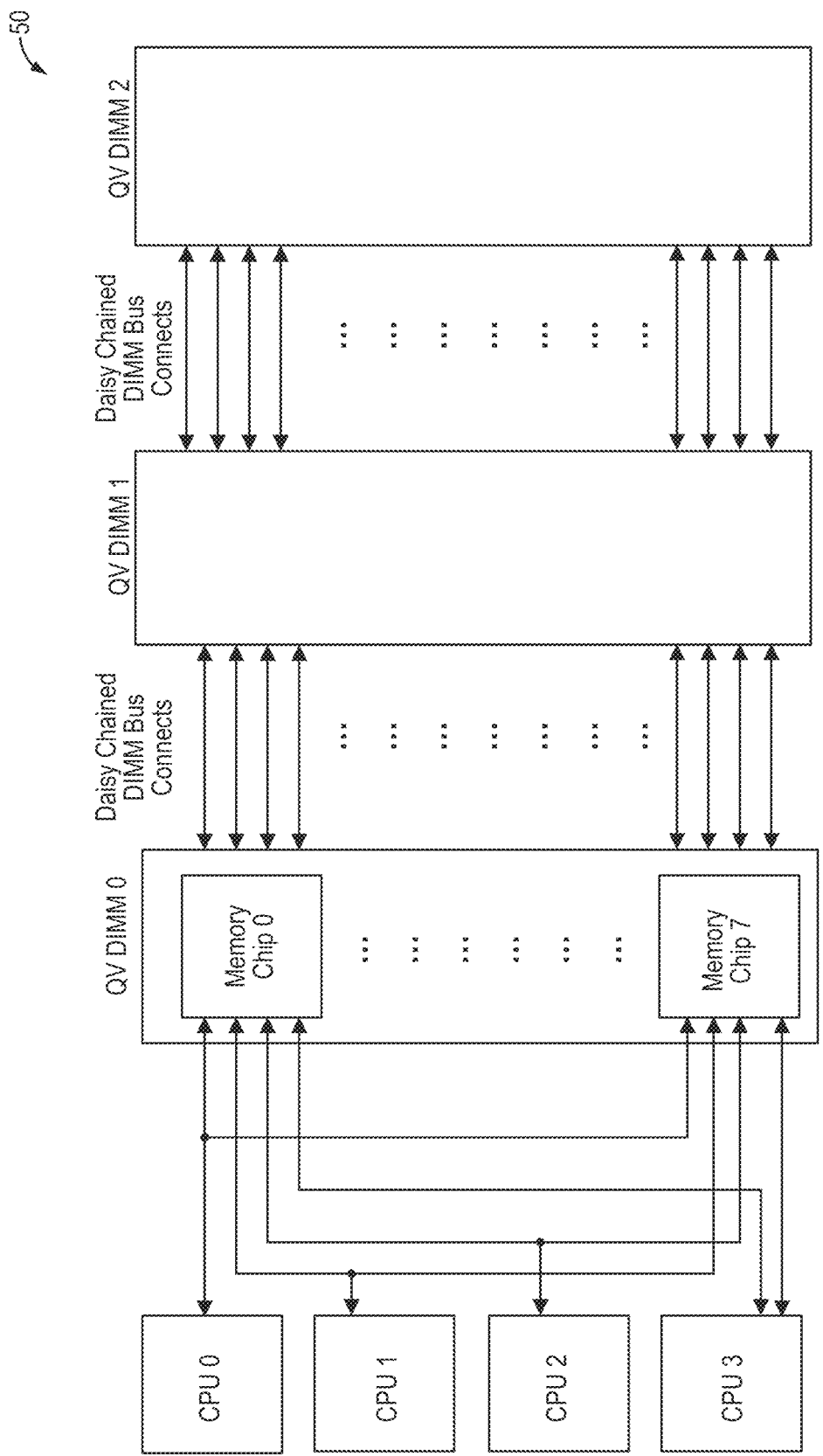
FIG. 5 illustrates a shared memory configuration in another example.

FIG. 5 illustrates a shared memory configuration in another example. Referring to FIG. 5, a computer system 50 may include multiple QV DIMM, such as QV DIMM 0 to QV DIMM2, configured for shared memory access by multiple processors, such as CPU 0 to CPU 3. In the present embodiment, the QV DIMM 0 to 2 are connected in a daisy chain configuration. The number of QV DIMM that can be connected in a daisy chain is a function of loading and stability. Each CPU connects, through a switching fabric, to a memory channel on each memory chip of the first QV DIMM0. The first QV DIMM0 connects to the other QV DIMM in a daisy chain fashion. As the interfaces becomes faster, the DIMM loading may have to decrease so that eventually the loading requirement results in only one DIMM for a memory channel. The limitation can make it difficult to build performance systems at the desired capacity.

In embodiments of the present disclosure, a QV memory module may be implemented as a system that integrates a QV memory die with a logic die (e.g., using hybrid bonding). Configurations of QV memory modules or circuits are disclosed, for example, in co-pending patent application Ser. No. 16/776,279, entitled "Device with Embedded High-Bandwidth, High-Capacity Memory using Wafer Bonding," filed on Jan. 29, 2020 ("the '279 Application"). The '279 application is hereby incorporated by reference in its entirety.

FIG. 6, which includes FIGS. 6(a), 6(b), 6(c) and 6(d), illustrates a QV memory module in examples of the present disclosure. As disclosed in the '279 application, a QV memory module or memory circuit may be built in a multi-die manner with at least one semiconductor die with a memory array ("memory die") and one semiconductor die with a memory controller ("controller die"), such as illustrated in FIG. 6(a). As shown in FIG. 6(a), a QV memory module 80 includes a memory die 81 and controller die 82 interconnected by copper interconnect conductors ("hybrid bonds" or "studs") 83. In the present illustrations, copper studs are used in a flip chip bonding method to connect the memory die to the controller die. The large number of hybrid bonds provide a high-bandwidth data interface. In some embodiments, the memory die 81 is constructed as a QV memory described in the '553 patent. For instance, the QV memory may be constructed as 3-dimensional arrays of NOR-type memory strings formed over a semiconductor substrate and is also referred to as a 3D QVM™.

Referring to FIG. 6(b), in some embodiments, the memory die 81 includes memory arrays of thin-film storage transistors where the memory arrays are organized as a 2-dimensional array of "tiles" (i.e., the tiles are arranged in rows and columns) formed above a planar semiconductor substrate. Each tile 85 can be configured to be individually and independently addressed or larger memory segments (e.g., a row of tiles or a 2-dimensional block of tiles) may be created and configured to be addressed together. In some examples, each row of tiles (a "tile row") may be configured to form an operating unit, which is referred to as a "bank" 86. A group of banks, in turn, form a "bank group" 87. In that configuration, the banks within a bank group may share data input and output buses in a multiplexed manner. As thus configured, the tile 85 is a building block that allows flexibility in configuring the system to adapt to application requirements. In the present description, the memory arrays in the memory die 81 are sometimes referred to as quasi-volatile memory circuits.

As shown in FIG. 6(c), each tile may also include row decoders and drivers 88, which activate word lines, each word line accessing a row of the memory cells within the tile. In one embodiment, within each tile are multiple columns of memory cells in multiple planes. The column decoders activate bit lines, with each bit line selecting a column of memory cells as well as a plane, such that, together with an activated word line, a memory cell is selected. In one embodiment, the memory cells within the planes in each column of memory cells share the same group of sense amplifiers within sense amplifiers 89. In one embodiment, the memory cells in the selected row form a "page" of memory cells that are sensed simultaneously and output by selecting the bit lines successively in a suitable group size (e.g., 8 bits ("byte") at a time). FIG. 6(*d*) shows that the bits of an activated page 92 are output to controller die 82 through studs 83. Any suitable page size (e.g., 1,024 or 2,048 bits) may be used.

Support circuitry for the memory array may be formed in the planar semiconductor substrate under the tiles. In one embodiment, the support circuitry for the thin-film storage transistors of each tile is provided for modularity in the portion of the semiconductor substrate underneath each tile. Examples of support circuitry include error-correction encoders and decoders, address decoders, power supplies, check-bit generators, sense amplifiers, and other circuits used in memory operations.

On controller die 82, a memory controller for accessing the memory arrays of memory die 81 is formed. The tile-based design of the memory die 81 naturally results in a modular organization of hybrid bonds to controller die 82, which leads to modularization of controller circuitry also. For example, the controller may adopt a design that is based on banks and bank groups to allow for simultaneous access to a large amount of data. Many variations of such a control scheme may be achieved by configuring data routing and control in the controller logic circuitry. Memory controller die 82 may also include one or more external interfaces, such as memory interfaces for host access and other system functions, in addition to conventional memory controller functions. Alternatively, the memory control functions may be divided between memory die 81 and controller die 82 (e.g., some controller circuitry may be implemented on memory die 81). In that regard, the '279 application discloses building a memory die using a process optimized for memory circuits and building a controller die using an advanced manufacturing process that is optimized for forming low-voltage and faster logic circuits. The controller die provides significant improvement over conventional circuitry that supports access to the memory arrays.

In one embodiment, the memory arrays on the memory die 81 is each an 8-layer (i.e., 8-plane) memory array which provides 8 pages of data with each activated row. If the number of layers is increased to 16, 16 pages of data are provided with each activated row without materially affecting the tile's footprint. With 4 planes and a 1024-bit page, each row in a tile has 4,096 bits. Of course, the number of rows in a tile may be adjusted for a greater or a lesser capacity to trade-off for a longer or a shorter access time, in accordance with the intended applications.

As described in the '279 application, multiple memory dies may be stacked atop one upon another and interconnected for data routing among the memory dies by, for example, through-silicon vias ("TSVs"). The stacked memory dies require maintaining an internal regular topological and control structure. For example, the memory arrays in each memory die in the stack may be controlled according to an assign-and-select methodology. Such an organization readily lends to a design that allows each memory die in the stack to have full access to the high bandwidth hybrid bond interface to the controller die. In addition, a customizable design allows many variations to adapt to various application needs; such variations may be realized by suitably configuring the controller logic circuitry in the controller die. The resulting memory system has a high memory capacity accessible by a high bandwidth memory interface.

The QV memory module—which integrates at least one memory die and one controller die—results in faster memory controller operations and, thus, faster memory performance. In addition, as the memory die or dies and the controller die or dies may be separately fabricated under their respective specialized manufacturing processes, the QV memory module enables the high-capacity memory arrays of the memory dies to be accessible at a high bandwidth from high-density logic circuits in the controller die, leading to new capabilities not previously achievable in conventional memory circuits. By integrating memory and controller dies that are each configured and optimized for specific memory operations, the QV memory module may achieve reduced die size in each memory or controller die. The dies may be integrated using one or more integration techniques, including, for example, hybrid bonds, TSVs, exposed contacts and other suitable interconnect techniques for a very high interconnection density. The resulting advantage is especially significant when multiple memory dies are stacked to provide a high memory capacity, while sharing a memory controller among the multiple memory dies achieves a reduced cost-per-unit.

As described above, in embodiments of the present disclosure, a QV memory module includes a memory die 81 including memory arrays that are organized as a 2-dimensional array of tiles 85. In the present description, a "tile" in the QV memory module refers to an autonomous mini-array of memory cells within the memory arrays. More specifically, a tile in the QV memory circuit refers to one or more regular arrays of addressable modular structures or building blocks of memory cells placed in a regular manner. As thus configured, the QV memory circuit can be segmented into independently addressable memory segments. For example, a memory segment of a desired size (e.g., a row of 32 tiles) may be achieved by configuring a group of tiles to form the memory segment, as desired.

Figure 7:
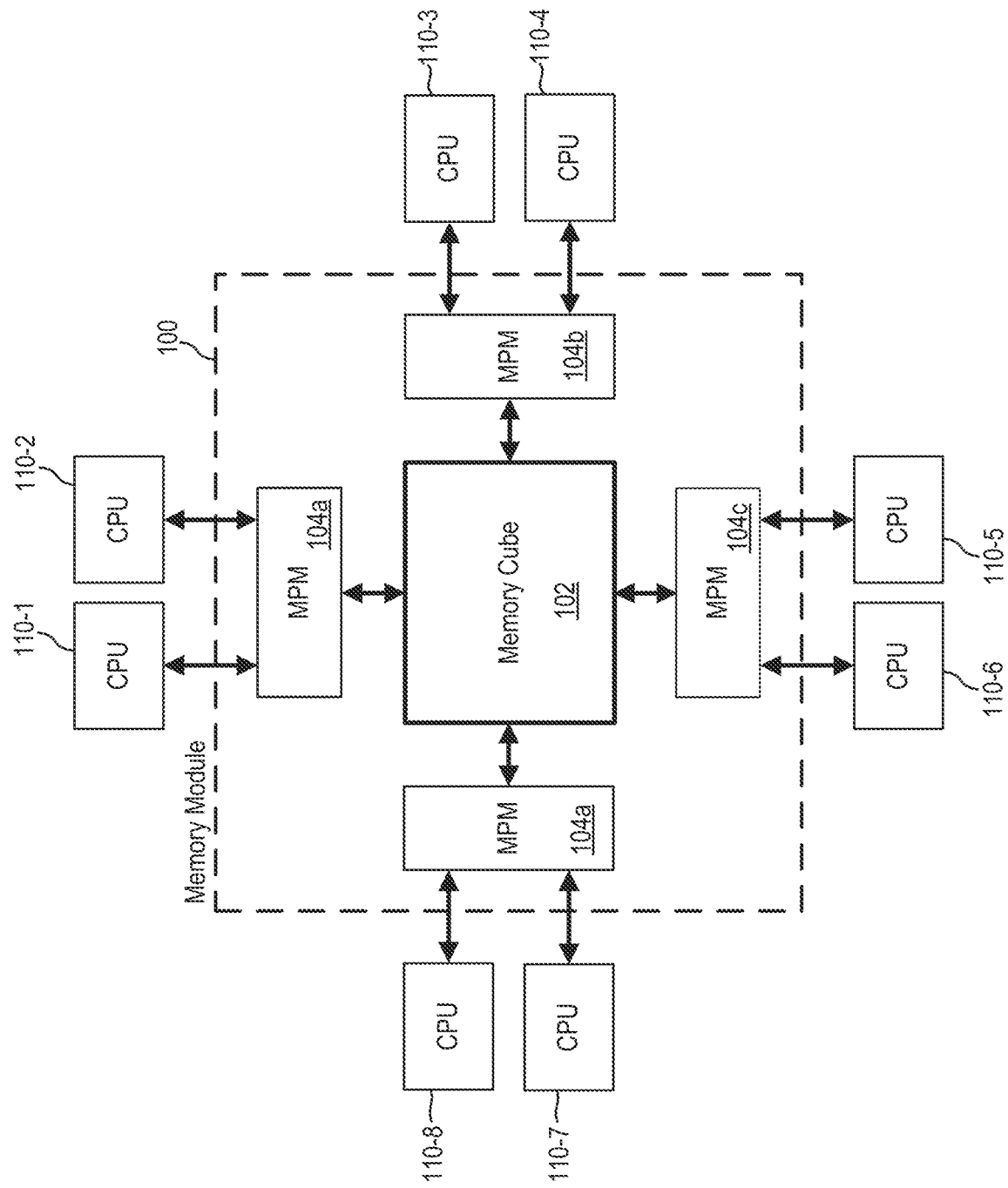
FIG. 7 illustrates a memory module for shared memory access in embodiments of the present disclosure.

FIG. 7 illustrates a memory module for shared memory access in embodiments of the present disclosure. The memory module of the present disclosure implements a memory-centric architecture and is particularly advantageous when applied in a memory-centric computing system. Referring to FIG. 7, a memory module 100 includes a memory cube 102 coupled to multiple multi-port memory (MPM) 104, for example MPM 104*a* to 104*d*. In the present embodiment, each multi-port memory (MPM) 104 is implemented as a QV memory module including a QV memory circuit with optional SRAM attached thereto. The QV memory circuit includes a memory cell array divided into partitions for shared access. Each MPM 104 includes multiple memory ports or memory interfaces for connecting to multiple memory channels and may include a switch circuit to connect the memory ports to access the memory partitions in the memory circuit. In the shared access scheme, the partitions of the QV memory circuit are accessible through each of the multiple memory ports of the MPM 104. The SRAM provides caching capability for data being exchanged on the memory interfaces of the MPM 104.

In the present embodiment, the memory cube 102 is a stacked die or stacked wafer of QV memory module with multiple memory ports and shared memory partitions. In some embodiments, the memory cube 102 is a QV memory module constructed as one or more QV memory dies coupled to at least one memory controller die. The memory cube 102 includes multiple memory ports for communicating with the multiple multi-port memories 104. In the present embodiment, the memory cube 102 is shown connected to four multi-port memories 104a to 104d. In some embodiments, the memory module 100 is constructed as a high capacity memory module built on an interposer. That is, the memory cube 102 and the multiple multi-port memories 104 are formed on the interposer and interconnected through conductive traces on or in the interposer. In some embodiments, the memory module 100 uses mini-BGA connectors on the interposer for the memory channels. In this manner, the memory module 100 may be located close to the processors, such as located close to or in the servers or the computing systems. In the present example, the memory module 100 is shown connected to processors 110-1 to 110-8. In particular, each MPM 104 may be used to connect to multiple processors 110. For example, the MPM 104a is connected to CPU 101-1 and 101-2. Similarly, the other MPMs 104 are connected to two or more processors. The memory module 100 may be used in memory-centric computing applications that are unavailable in current DRAM-based system architectures.

Figure 8:
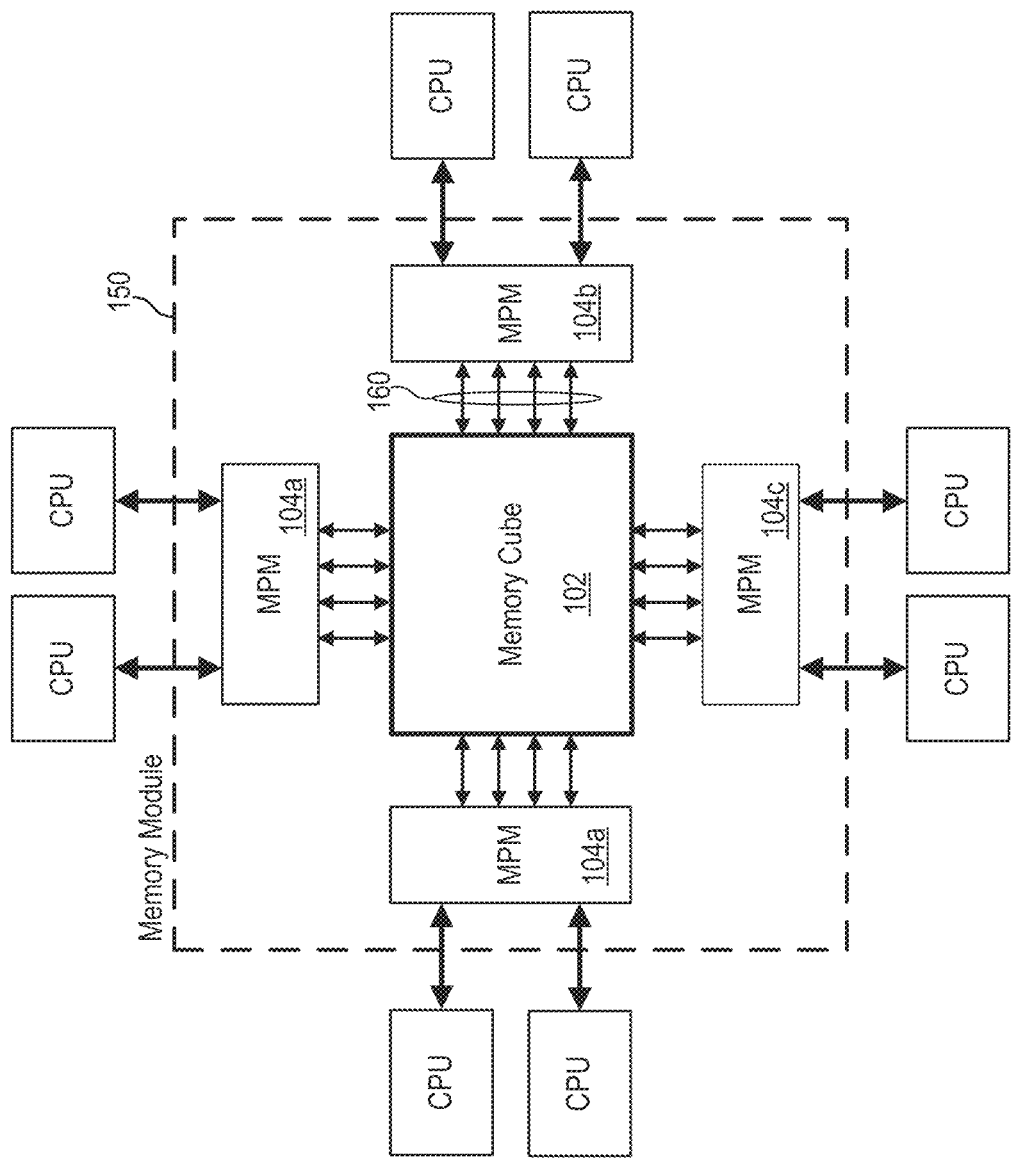
FIG. 8 illustrates a memory module for shared memory access in alternate embodiments of the present disclosure.

FIG. 8 illustrates a memory module for shared memory access in alternate embodiments of the present disclosure. Like elements in FIGS. 7 and 8 are given like reference numerals to simplify the discussion. Referring to FIG. 8, the memory cube 102 communicates with each of the multiple MPMs 104 through a memory data bus 160. In the present embodiment, the memory data bus 160 is a high speed and high capacity data bus, capable of moving a large amount of data at a high data rate.

As thus configured, the memory modules of FIGS. 7 and 8 realize a high density memory suitable for memory-centric applications. Memory management may be performed by a master server to perform allocation and deallocation of memory blocks to a given memory channels. The master server may execute a memory manage to maintain coherency across the platform.

Figure 9:
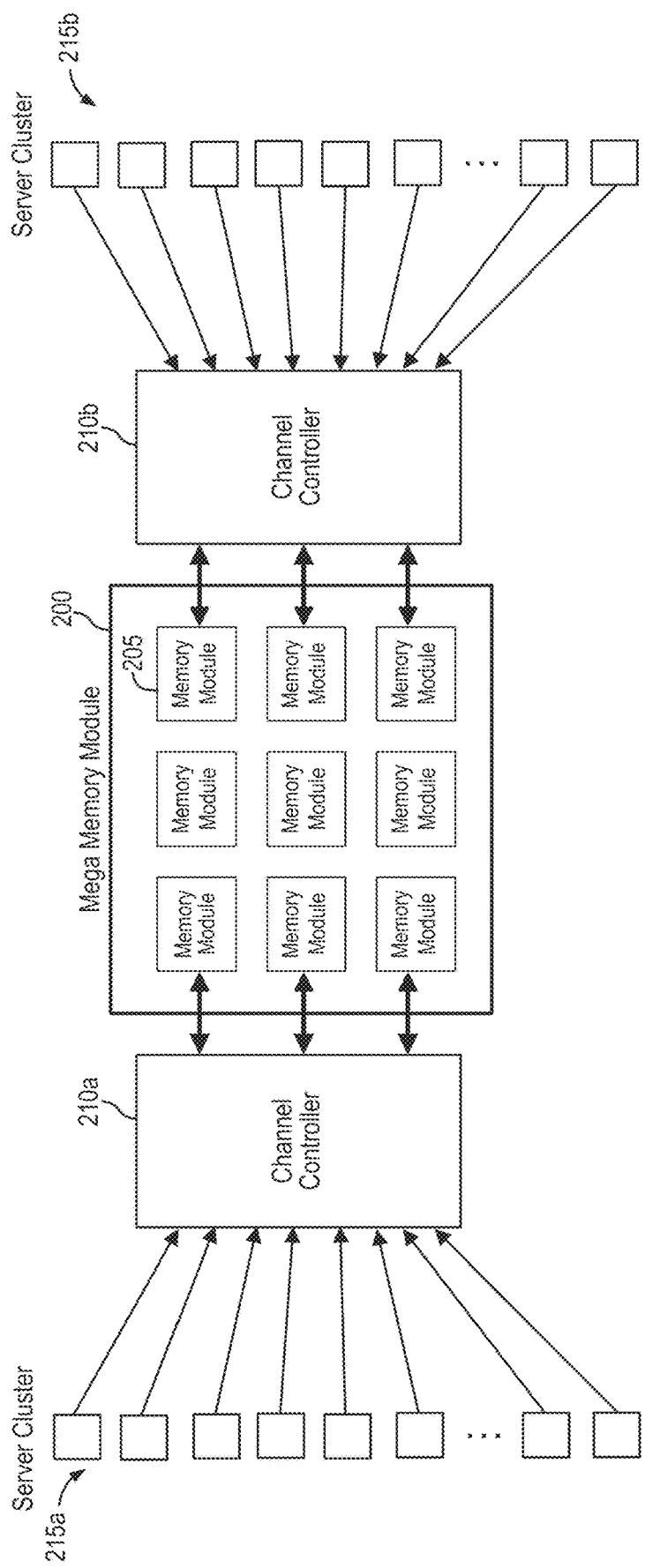
FIG. 9 illustrates a memory module for shared memory access in alternate embodiments of the present disclosure.

FIG. 9 illustrates a memory module for shared memory access in alternate embodiments of the present disclosure. Like elements in FIGS. 7-9 are given like reference numerals to simplify the discussion. Referring to FIG. 9, a memory module 200 may be constructed using an array of memory modules 205. Each memory module 205 may be constructed as a QV memory module, as described in FIG. 6, and may include one or more QV memory circuits formed as a stacked die structure with one or more memory controller circuit. In this manner, the memory module 200 is provided with super high density and is referred to as a mega memory module. In the present embodiment, the mega memory module 200 includes multiple memory ports which are connected to one or more channel controllers 210 to enable shared access to the array of the memory module. For example, the mega memory module 200 may communicate with the channel controllers 210 through memory ports that are each a high bandwidth data bus to move large amount of data between the memory module 200 and each of the channel controller. In the present embodiment, the mega memory module 200 is connected to channel controller 210a and 210b. In the present description, shared access to the array of memory module refers to the memory ports being able to carry out memory access in parallel. That is, each memory port can access the array of memory modules at the same time to retrieve or to store memory data. In some embodiments, the array of QV memory modules 205 of the memory module 200 are formed on an interposer and are connected to the memory ports of the memory module 200 by conductive traces formed on or in the interposer.

In some embodiments, the channel controller 210 can be constructed as described in Provisional Application V. In some embodiments, the channel controller 210 may include host interface circuits for receiving from host processors memory access requests to the mega memory module 200, a priority circuit which prioritizes the memory access requests to avoid a memory access conflict and which designates each prioritized memory access request to one of the memory ports for carrying out the memory access specified in that prioritized request; a switch circuit; and memory interface circuits, each coupled to an associated one of the memory ports of the mega memory module. In operation, the switching circuit routes to each memory interface circuit the prioritized memory access requests designated for its associated memory port.

In some applications, each channel controller 210 may be coupled through the host interface circuits to a server cluster 215. For example, the channel controller 210a may be coupled to a server cluster 215a and the channel controller 210b may be coupled to a server cluster 215b. As thus configured, the mega memory module 200 provides data to support the operation at the server clusters 215.

In embodiments of the present disclosure, the memory module 100, 150 or the mega memory module 200 do not have to operate as deterministic memory as the memory data are transmitted on memory data buses implemented using a custom high speed, high density memory bus or using standard memory buses such as CXL which operate based on data packets.

Figure 10:
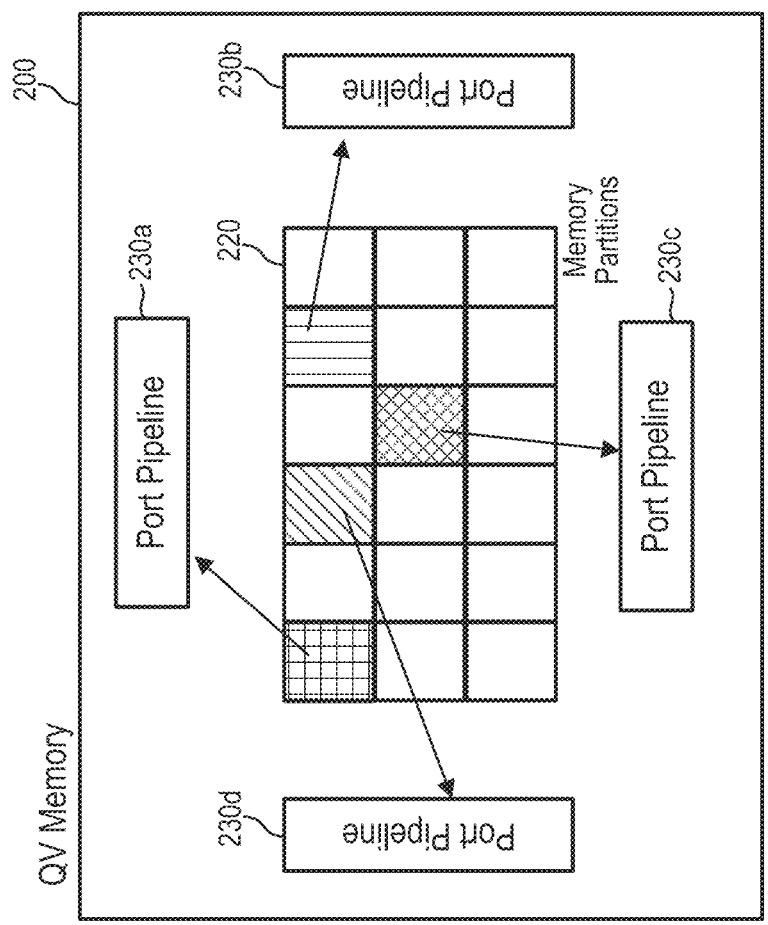
FIG. 10 illustrates the internal module bus usage structure in examples of the present disclosure.

FIG. 10 illustrates the internal module bus usage structure in examples of the present disclosure. Referring to FIG. 10, a memory module 200 includes a memory array divided into memory partitions 220 and multiple ports 230 for external memory access. For example, the memory module 200 may include memory ports 230a-230d. In operation, each port 230 accesses a memory partition 220 transferring sequential pages until the communication protocol stops the transfer. The first data transfer starts from the address given and each transfer after that is in sequential order. The memory will automatically cross page boundaries to keep the data flow going. If SRAM is incorporated in the memory module, the memory data can be sent from the SRAM to speed up the data transfer.

Figure 11:
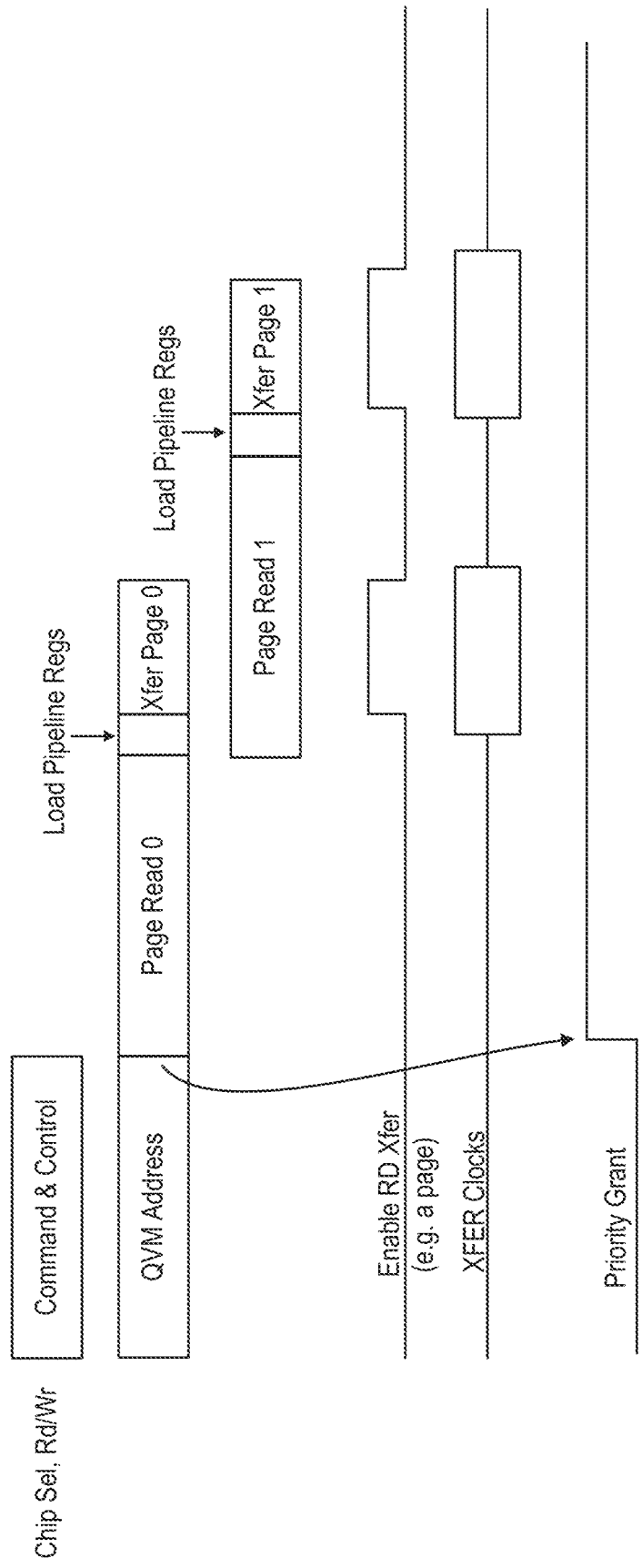
FIG. 11 illustrates a port pipeline operation for a read access in examples of the present disclosure.

FIG. 11 illustrates a port pipeline operation for a read access in examples of the present disclosure. Referring to FIG. 11, a read operation starts in response to receiving a read command from the host and the memory address is provided on the memory bus. The memory channel associated with memory address requests priority access and the memory module grants priority to the memory channel requesting access. If the memory module has SRAM incorporated therein, the memory module first looks for the data in the SRAM. If the data is not present in the SRAM, then the memory module read from the QV memory in the memory array. For read access to the QV memory, a wait state may be asserted for a short time. Because the memory ports are packetized interfaces, the memory host blade can absorb the wait which is then transparent to server. In operation, the memory module always try to have the next page in the SRAM at the end of a read operation to so that data is always available in the SRAM.

Figure 12:
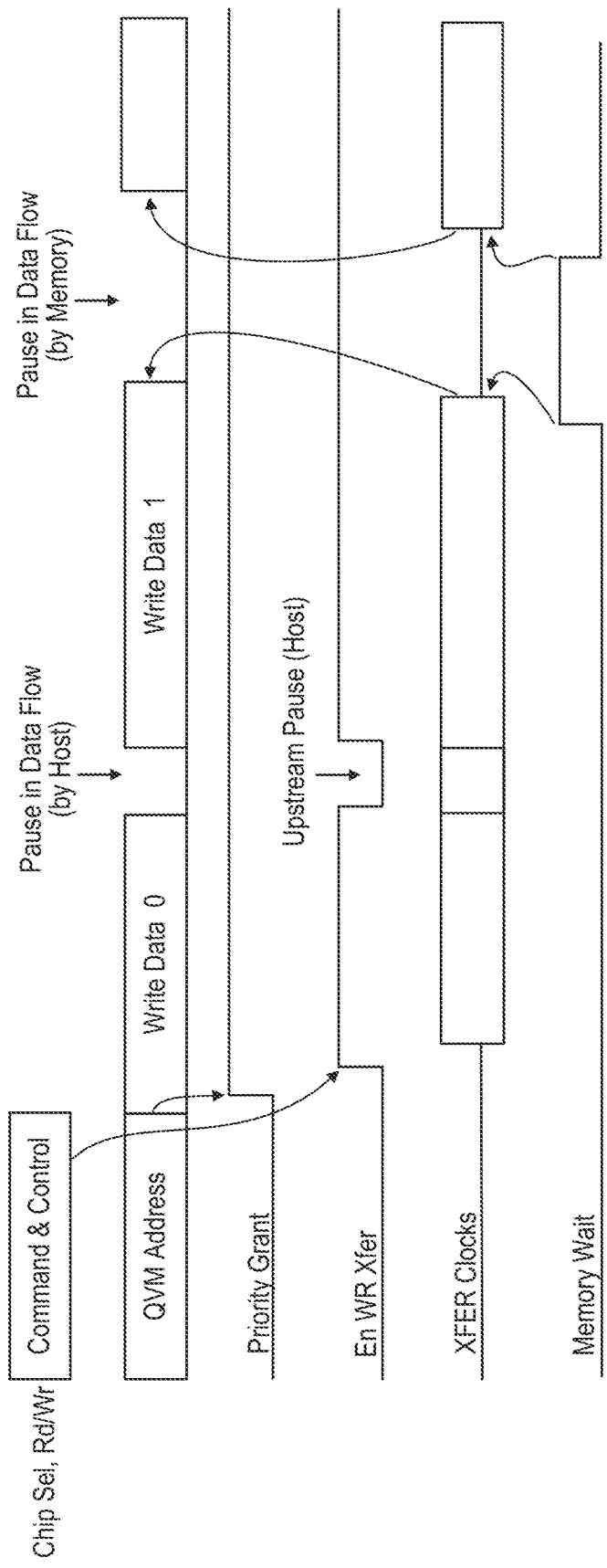
FIG. 12 illustrates a port pipeline operation for a write access in examples of the present disclosure.

FIG. 12 illustrates a port pipeline operation for a write access in examples of the present disclosure. Referring to FIG. 12, a write operation starts in response to receiving a write command from the host and the memory address is broadcasted on the memory bus. The memory channel associated with memory address requests priority access and the memory module grants priority to the memory channel. The requesting memory receives the priority select signal. The write data is sent to the memory and stored in SRAM buffers, if available. The write data continues to be sent to be written into memory unless the following occurs. In one example, during the write operation, the host is not done but has run out of write data because of host side issues. In that case, the host deasserts the enable write transfer signal. This will stall or create a pause in the memory write operation. In another example, the host is sending write data but the memory buffer is full or the memory write in progress is not completed yet. In that case, the memory put up wait state that pauses the host interface transfers. For instance, the wait state may stop the packet handshake or if the host interface is using DDR, the memory module may assert the Busy on Ready or Busy signal on the interface.

The memory write operation to the QV Memory is done at the following times. First, during refresh time when memory data is being read and written back into the memory. Second, when the SRAM buffer is almost full, then the write data is written to the QV memory. Third, when there is no pending port requests for the block, then a write operation to the QV memory may be performed. In some cases, if a read access occurs during a write operation, the memory module puts up wait states.

Figure 13:
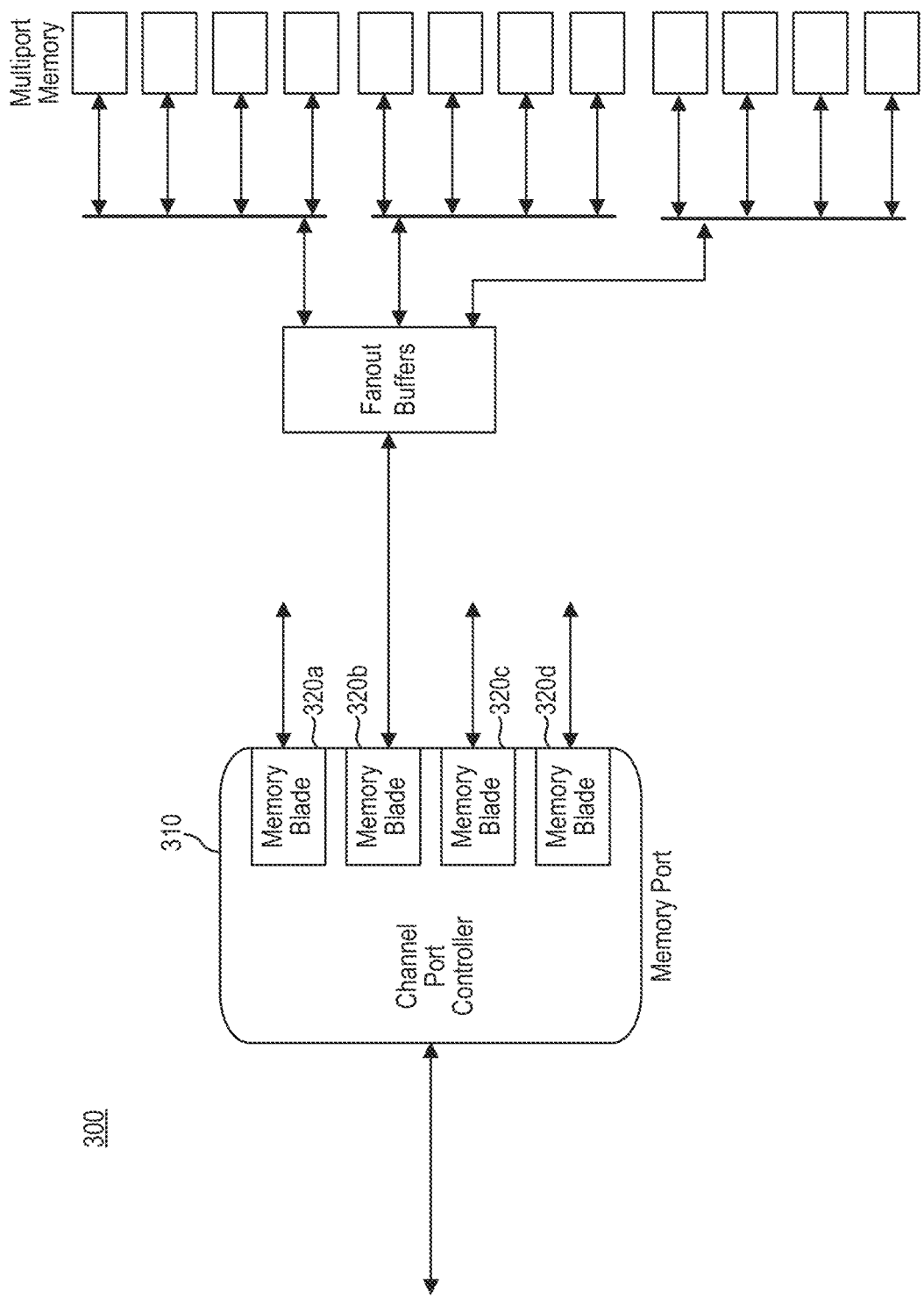
FIG. 13 illustrates the memory bus structure in a memory cube in embodiments of the present disclosure.

FIG. 13 illustrates the memory bus structure in a memory cube in embodiments of the present disclosure. In particular, FIG. 13 illustrates an example fanout and memory array configuration in the memory cube. Referring to FIG. 13, a memory cube 300 includes a channel port controller 310 including four memory ports. Accordingly, the memory module 300 includes four memory blade ports 320 shared over the memory array. In the present configuration, there are twelve QV memory die for each memory blade 320. Thus, for the four memory blades, there will be 12×4 or 48 QV memory dies in the cube. At 8 GB per QV memory die, the memory cube can have a capacity of 384 GB. FIG. 13 illustrates one fanout configuration. Other fanout configuration are possible by considering memory capacity and speed.

In some embodiments, a mega memory module can be constructed by using 32 memory cubes for more. For example, 32 memory cubes each with 384 GB capacity yield a mega memory module of 12 TB. A server could expand on the number of ports it uses to connect to the mega memory module. In the one example, the mega memory module can be connected to 32 servers each using the PCIe memory interface.

In the above described host memory systems, the memory module can be designed to support RDMA (Remote Direct Memory Access) such that very fast blocks of data can be moved in and out of the functional memory in the NUMA environment. There are many configuration options possible for the memory cube, from a small to a very large memory capability. As memory is much larger than the NUMA memory, it will be treated as virtual memory that is moved to main memory with a virtual to physical mapping table. The memory cube is best served if the DDR interface is removed and the memory operates as a wide fast memory. In some examples, if stacked memory die is used, the partitioning may be done in groups per die. In some examples, serial interfaces may be used if the pin count is high. Alternately, interposer boards may be used for die stacking, to realize small fast memory modules.

Figure 14:
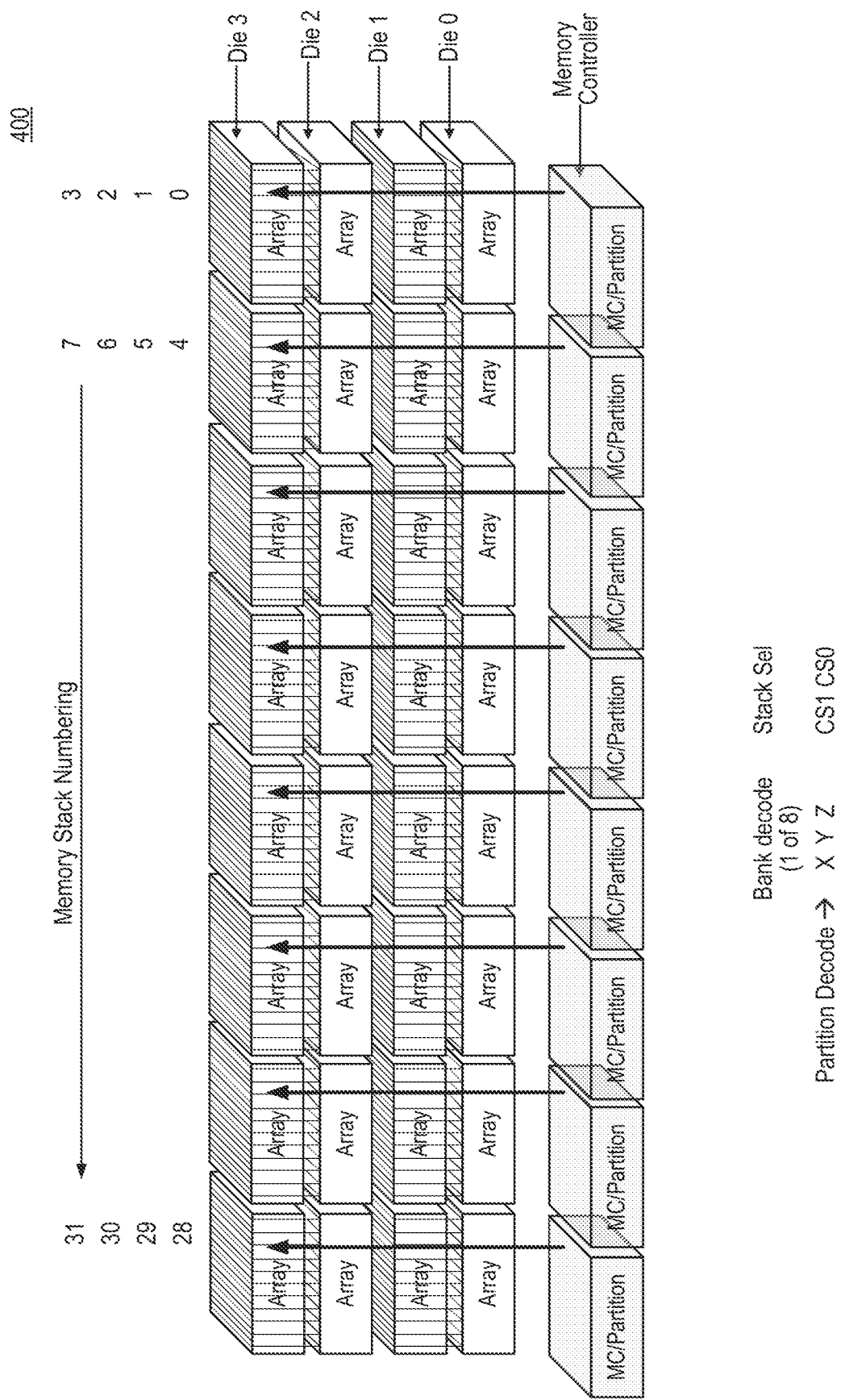
FIG. 14 illustrates a memory cube with die stacking and partitioning scheme within the memory cube in examples of the present disclosure.

Memory die stacking can be used advantageously to build a memory cube with high memory capacity. FIG. 14 illustrates a memory cube with die stacking and partitioning scheme within the memory cube in examples of the present disclosure. Referring to FIG. 14, four memory dies 0 to 3 are stacked to form a memory cube 400. The memory array on each memory die is partitioned into banks on the die and the banks are multiplexed so one of the channels is selected and given operation control to that bank.

If dies are stacked the banks are connected vertically, then the banks across the dies 0 to 3 must share that grouping of memory connects. This means that a stacked die will appear as a bigger group of partitioning built vertically. The chip selects will then be arranged to act as decoders for the vertical partitions.

In one example, a die has 16 partition blocks. If a channel takes one block, there are 15 partitions for the other 3 channels in the 4-channel example. If another die is stacked that has the same access, then there are 32 partitions with a port only taking one partition out of the available pool. However, the memory is physically shared vertically and partition on one die also removes the other partitions in the stack because of shared line usage. Therefore, a 4-die stack will remove the 4 partitions in that stack from simultaneous access. With this consideration the address layout should be done such that memory is arranged in groups partitioned vertically and horizontally. FIG. 14 illustrates one example of horizontal and vertical partitioning.

Figure 15:
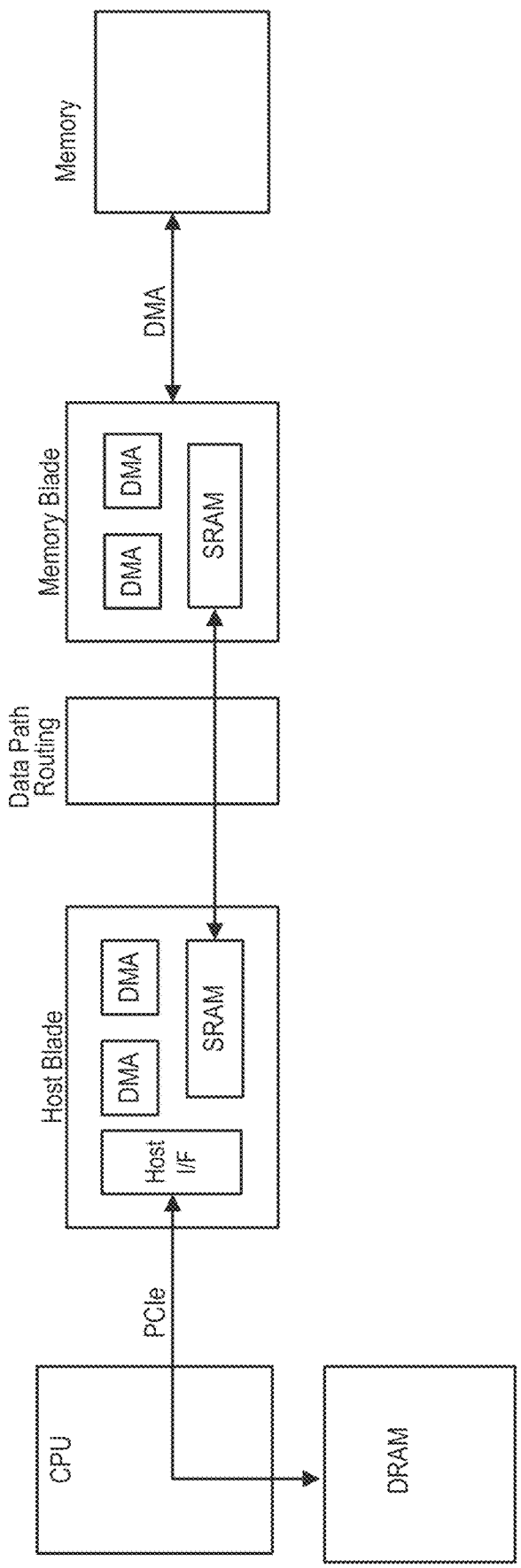
FIG. 15 illustrates the data path as used in a channel controller in embodiments of the present disclosure.

FIG. 15 illustrates the data path as used in a channel controller in embodiments of the present disclosure. In the present embodiment, memory data from the memory is passed in DMA mode with overlapping operation for fast pipelined packets or blocks of data transferred. The CPU transfer will be RDMA instead of a DDR handshake. The data path can be configured to realize a low latency data path, with minimum latency and fast throughput.

Figure 16:
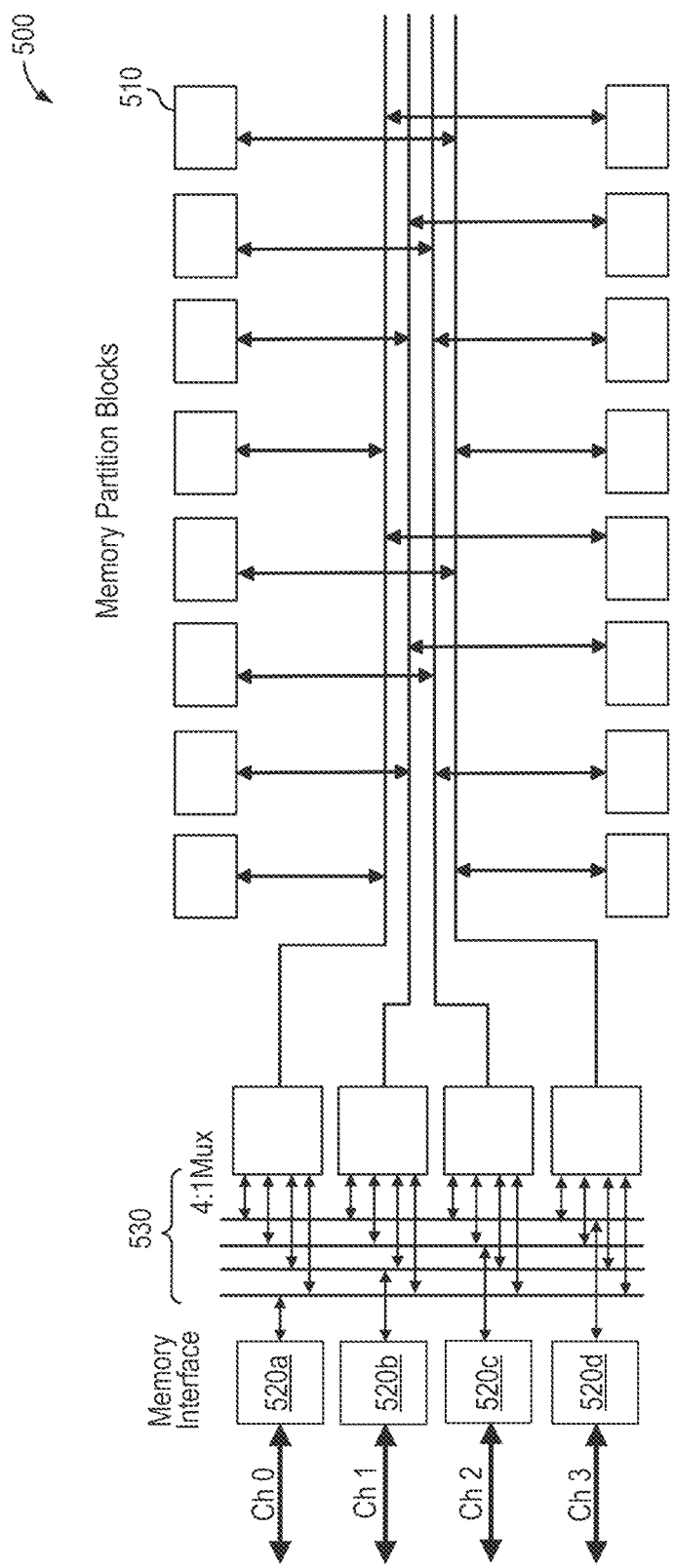
FIG. 16 illustrates a memory architecture for the memory cube in embodiments of the present disclosure.

FIG. 16 illustrates a memory architecture for the memory cube in embodiments of the present disclosure. Referring to FIG. 16, the memory cube 500 includes storage transistors arranged in memory partition blocks 510. The memory cube 500 includes a memory interface 520 coupled to four memory channels Ch 0 to Ch 3. The memory interface 520 thus includes memory interface circuit 520a to 520d coupled to respective memory channels Ch 0 to Ch 3. In the present embodiment, the memory interface 520 is a simple wide DMA (direct memory access) type interface. The memory interface 520 accesses the memory partitions 510 by multiplexing through multiplexer 530. In some cases, the memory partitions can be grouped to reduce the number of blocks coupled to the multiplexer 530.

In the configuration as shown in FIG. 16, access conflicts can occur where wait states would be generated. In other embodiments, another level of multiplexing can be added to guarantee full simultaneous access. Alternately, the memory partitions 510 can be grouped to reduce the number of blocks requiring multiplexing.

In embodiments of the present disclosure, the memory cube is constructed using wafer level stacking. In this manner, a memory cube with large capacity can be formed. FIG. 17, which includes FIGS. 17(a), 17(b) and 17(c), illustrates various configuration for forming a wafer level memory stack in embodiments of the present disclosure. Referring to FIG. 17, a wafer level memory stack can be formed using a wafer section 610 of memory dies. In the present illustration, a wafer section 610 of 8 memory dies is used, as shown in FIG. 17(a). A wafer stack 620 is then formed by stacking the wafer sections 610. For example, a stack of 8 wafer sections is shown in FIG. 17(b). The eight-wafer stack is coupled to a memory controller 630 to form a memory cube.

In some embodiments, additional memory controllers 630 can be provided to add additional memory ports and more partitions to the memory cube. In this manner, the partitioning and ratio of memory ports to capacity can be made well balanced. For example, the memory cube can be formed by coupling every four stacked wafer sections to a memory controller 630. As shown in FIG. 17(*c*), each set of four stacked wafer sections is coupled to a memory controller 630 (630*a* or 630*b*). Connector channel tower 640 may be used to interconnect the memory controllers 630*a* and 630*b*. The connector channel tower 640 may be formed by grouped through-silicon vias (TSV) connecting to ball grid arrays formed on the memory controller dies. The wafer level memory stack realizes high memory capacity and also enable simultaneous access with minimal access conflicts.

In embodiments of the present disclosure, the memory module for shared memory access can be advantageously applied to as computational memory in artificial intelligence and server clusters applications. Many applications of the memory module is possible. In a first example, the memory module of the present disclosure can be applied in portable computers or laptop computers. The memory module has small form factor and is lower power. For example, the QV memory in the memory module can be shut down in partitions to save power and even totally shut off for small programs that can operate out of the SRAM, if available.

In a second example, the memory module of the present disclosure can be applied to personal computer and low-end servers. The memory module can provide sufficient speed, especially when SRAM is used as a buffer or cache memory. In a third example, the memory module of the present disclosure can be applied in high end servers. The memory module of the present disclosure can be stacked and located next to the CPU for enhanced memory performance. Alternately, the memory module can be located on accelerator boards and communicate with the processor through PCIe or Gen-Z type buses. These interfaces are packet based and not deterministic so the QV memory can be advantageous applied in the high-end server applications.

In a fourth example, the memory module of the present disclosure can be applied in large systems that can share large amounts of memory. The memory module of the present disclosure has a flexible architecture and can provide unparallel density and speed as compared to traditional memory solutions. In some cases, the memory module can be constructed as a mega memory module with processors incorporated inside in the module structure. The flexible memory bus architecture enables fast processing speed at lower power, making the memory module suitable for computationally intensive applications, such as AI and computational memory.

Computational Memory as Part of Memory Centric Systems

In embodiments of the present disclosure, the memory module for shared memory access described above is configured for use as a computational memory in memory centric systems. Various configurations for computational memory storage can be implemented.

In one embodiment, a computational memory is constructed using RISC processors combined with shared-access memory modules. The shared-access memory modules provide large memory capacity and fast access speed. The computation memory may include other circuit blocks to implement support circuitry. As thus, the computational memory thus constructed can offer fast cycle time as the RISC processors have access to large capacity memory that is integrated with the processors in the same system.

In another embodiment, a computational memory is constructed using an array of mini cores combined with shared-access memory modules. In the present description, mini cores refer to processors that are used in combination with a main CPU block to offload processing tasks for the main CPU. Mini cores are usually configured as an array of processor cores that run in parallel and can execute processing of large blocks of data in parallel for the main CPU. For instance, mini cores functions in a similar way to a graphic processing unit (GPU) to the main CPU. In some embodiments, the computational memory is constructed using an array of mini cores. In some examples, four or more mini cores are used. The computational memory can be constructed as a system that integrates the mini cores with the memory modules of the present disclosure formed using the QV memory as the memory array. In the integrated system, the memory modules can be positioned close to the mini cores to improve speed and reduce power. In some embodiments, the mini cores are fabricated on an advanced semiconductor fabrication process to achieve high performance.

In another embodiment, the computational memory can be constructed using the memory modules described above in combination with specialized circuitry to realize systems with new functionalities. For example, in some embodiments, the computational memory may be constructed using the memory modules integrated with neural net structures, such as artificial intelligence (AI) chips, to create a machine learning or AI system.

Figure 18:
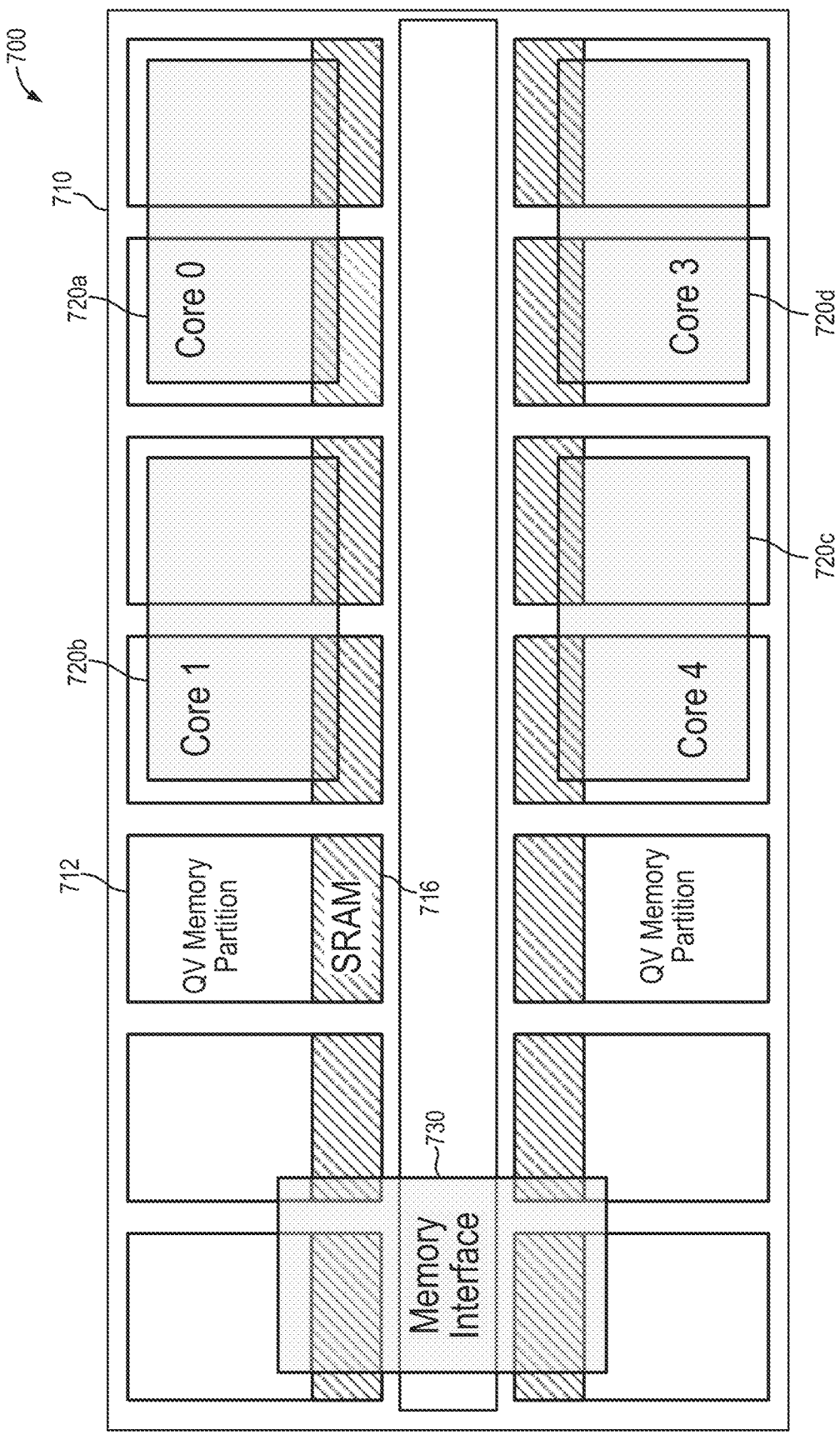
FIG. 18 illustrates a mini core-memory module incorporating the memory modules of QV memory modules in embodiments of the present disclosure.

FIG. 18 illustrates a mini core-memory module incorporating the memory modules of QV memory modules in embodiments of the present disclosure. Referring to FIG. 18, a mini core-memory module 700 includes a QV memory circuit 710 coupled to a mini core array including processor cores 720*a* to 720*d*. The QV memory circuit 710 includes quasi-volatile memory circuits that are formed in one or more memory dies where the memory circuits are divided into memory partitions 712. Multiple memory dies may be stacked and interconnected using through-silicon vias. In the present embodiment, each of the memory partitions 712 is associated with a SRAM 716. SRAM 716 provides memory caching capability to ensure that each memory partition performs as a high-capacity and low effective latency memory. In the present embodiment, the mini core array includes four processor cores 720*a* to 720*d* (Core 0 to Core 3). The mini processor cores 720*a* to 720*d* (or "mini cores") can be formed on a companion chip or a memory controller circuit where the memory controller circuit is connected to the memory die to operate the quasi-volatile memory circuits as one or more quasi-volatile memories. The mini processor cores 720*a* to 720*d* can access the quasi-volatile memory circuits in parallel to realize a shared memory scheme. In one embodiment, the mini cores 720*a* to 720*d* are connected directly to the SRAMs 716 to realize a fast and lower power interconnect.

A memory interface circuit 730 may also be provided on the companion chip to facilitate communication with the host processor. In some embodiments, the SRAMs 716 can be provided on the companion chip. In the present embodiment, the mini-core memory module 700 includes the quasi-volatile memory circuits being formed in one semiconductor die and the mini processor cores 720 being formed in another semiconductor die together with the memory controller circuit. The memory controller circuit can be bounded to the memory die through flip chip bonding or using hybrid bonds.

In the present description, the mini cores 720*a* to 720*d* refer to processors or processing units that are often used in combination with a main CPU block to offload processing tasks for the main CPU. The mini cores 720a to 720d are configured to execute processing tasks in parallel and to handle processing of large amount of data. In embodiments of the present disclosure, the memory partitions 712 in the QV memory circuit 710 provides the mini cores 720a to 720d with data for the parallel processing. In one embodiment, a DDR interface is used to transfer memory data between the QV memory circuit 710, the SRAM 716 and the mini cores 720a to 720d where the mini cores operate on the data. In other embodiments, other types of interface can be used between the mini cores and the SRAM 716 and the QV memory module 710. For example, a high bandwidth or massively parallel interface can be used in other embodiments. In another example, the mini processor cores can access the SRAM 716 and QV memory module 710 using DMA (direct memory access) mode. The mini cores 720a to 720d can be configured with execution codes to operate the memory data to which they are directly connected. As thus configured, the memory module 710 is configured to dedicate the entire memory to keep the mini cores operating. All of the QV memory partitions 712 are operated to feed memory data to the mini cores.

In embodiments of the present disclosure, the mini core-memory module 700 has many applications in computing systems. In one example, the mini core-memory module 700 can be used as an accelerator to provide additional processing capability for a main CPU of a computing system. For example, the mini core-memory module 700 can be used as an instant compute accelerator in a computing system. In another example, multiple mini core-memory module can be combined to form an AI computing system. In further examples, the mini core-memory module of the present disclosure can be used as the basic building blocks for complex computing systems, such as encryption engines or video compression engines. In other examples, the mini core-memory module can be used in parallel computing applications for control tasks or data flow. In some embodiments, the mini core-memory module 700 can be constructed using wafer level stacking, as will be described in more details below.

Figure 19:
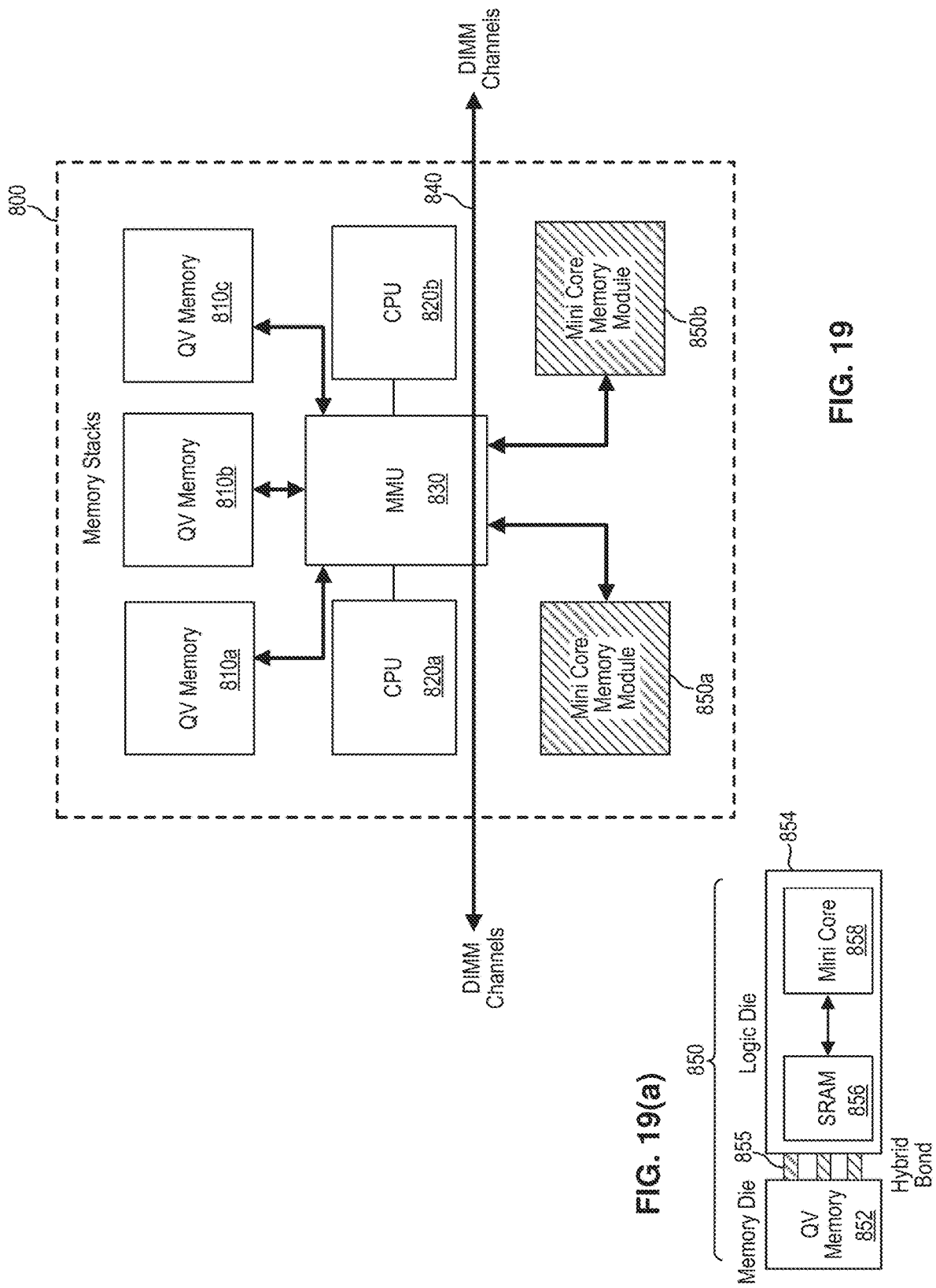
FIG. 19, which includes

FIG. 19, which includes FIG. 19(a), illustrates an application of the mini core-memory module as a computational memory in a memory centric computing system in examples of the present disclosure. Referring to FIG. 19, a memory centric computing system 800 includes processing units (CPU) 820a and 820b in communication with a memory management unit (MMU) 830. Data to be processed by the CPU 820a and 820b are stored in a variety of memory devices. For example, the computing system 800 may include one or more QV memory modules 810, such as QV memory modules 810a to 810c. The computing system 800 may further include one or more mini core-memory modules, such as mini core-memory modules 850a, 850b. The memory management unit 830 communicates with all of the memories in the computing system 800 and manages the transfer of data between the memories and the CPU. The mini core-memory modules 850a,b provide computation memory capability to the computing system.

FIG. 19(a) illustrates the structure of the mini core-memory module in embodiments of the present disclosure. In the present embodiment, the mini core-memory module 850 includes a memory die 852 with quasi-volatile memory circuits formed thereon. The memory die 852 is bonded to a controller die 854, such as through hybrid bonding 855. The controller die 854 includes SRAM 856 in communication with an array of mini processor cores 858. As thus configured, the mini processor cores 858 execute tasks designated to it by the CPU 820a or 820b using data stored in the memory array on the memory die 852 and buffered or cached by SRAM 856.

Figure 20:
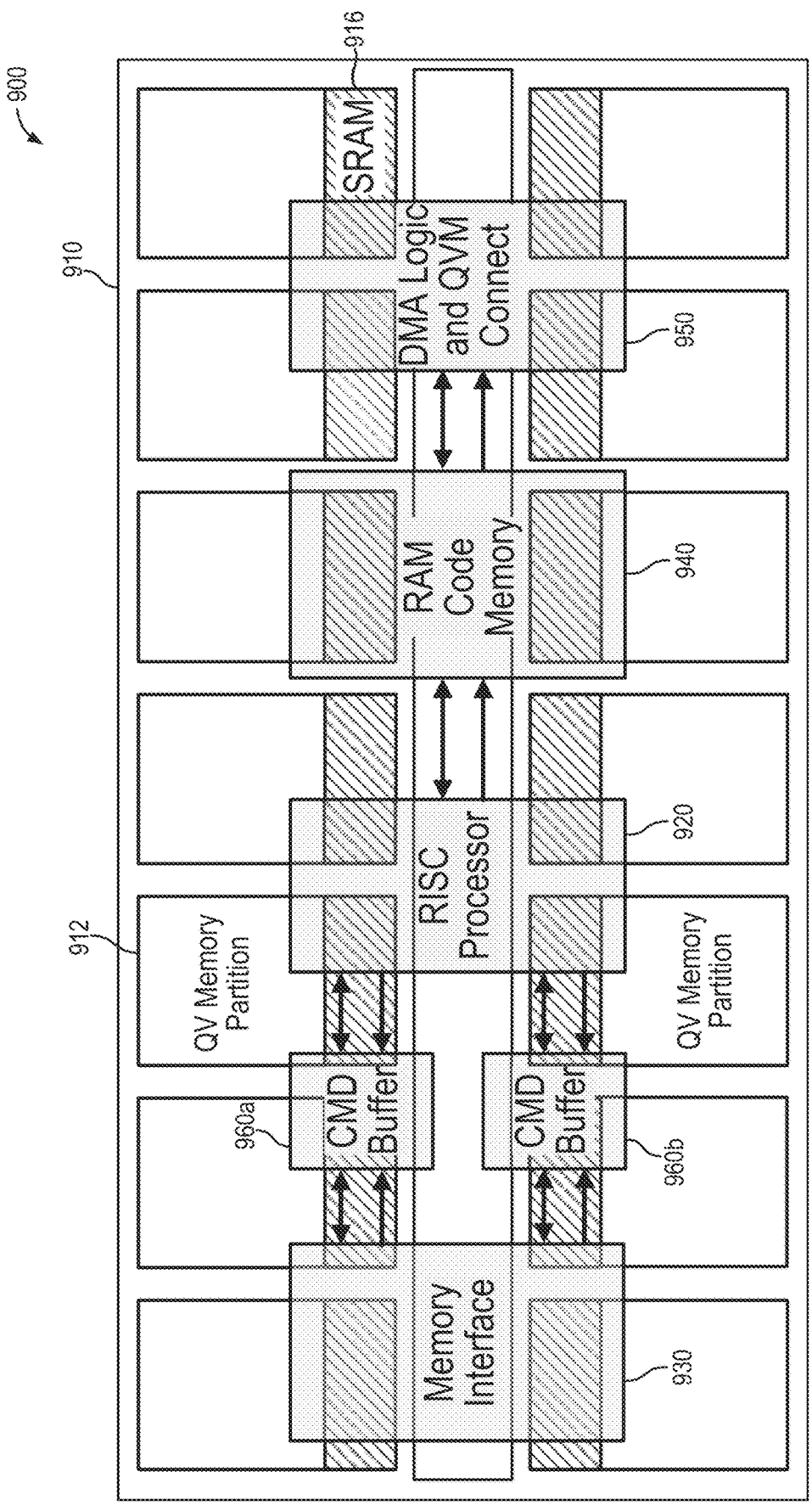
FIG. 20 illustrates a computational memory incorporating a QV memory in embodiments of the present disclosure.

FIG. 20 illustrates a computational memory incorporating a QV memory in embodiments of the present disclosure. Referring to FIG. 20, a computational memory 900 integrates a RISC processor 920 with a QV memory module. The term "RISC," which stands for "reduced instruction set computer," encompasses any customized processor circuitry and those processor cores available from ARM, MIPS and IBM's PowerChip, graphics processing units (GPUs), and any other suitable processor or circuit generally incorporated into a logic circuit using the "system-on-a-chip" (SOC) approach. The QV memory circuit 910 is constructed using quasi-volatile memory circuits divided into memory partitions 912. The QV memory circuit 910 provided in a semiconductor die, also referred to as a memory die. In the present embodiment, each of the memory partitions 912 is associated with a SRAM 916. SRAM 916 provides memory caching capability to ensure that each memory partition performs as a high-capacity and low effective latency memory. The computational memory 900 includes the RISC processor 920 formed on a separate semiconductor die. In the present embodiment, the RISC processor may be formed on a memory controller circuit configured to operate the quasi-volatile memory circuits as one or more quasi-volatile memories. Furthermore, the SRAM 916 may be formed on the semiconductor die of the memory controller circuit.

The RISC processor 920 operates in conjunction with a RAM code memory 940 and a DMA logic and QVM connect circuit 950 which provides memory access to the QV memory circuit 910. The DMA logic and QVM connect circuit 950 enables the RISC processor 920 to access the QV memory circuit through DMA mode. The computational memory 900 further includes a memory interface 930 provided to facilitate communication with the host. Command buffers 960a, 960b are provided to buffer the command and data transfer between the QV memory circuit 910 and the RISC processor 920. In actual implementation, the RISC processor is formed on a semiconductor die bonded to memory module semiconductor die, such as through flip chip bonding or using hybrid bonds.

In operation, the computation memory 900 may use most of the SRAMs for code and command status transfers. The RISC processor 920 will share access to all banks of QV memory with the host port (memory interface 930). Code can be loaded from the memory port (memory interface 930) or from an I²C Port. Data can be moved from the QV memory module to the SRAM for code overlays. The computation memory 900 can act as an embedded processor with DRAM capabilities. In some cases, the RISC processor can be put to sleep if not used to save power. Furthermore, the RISC processor can perform memory checks. In sleep mode, the RISC processor may periodically wake to perform memory refresh of the QV memory arrays.

Figure 21:
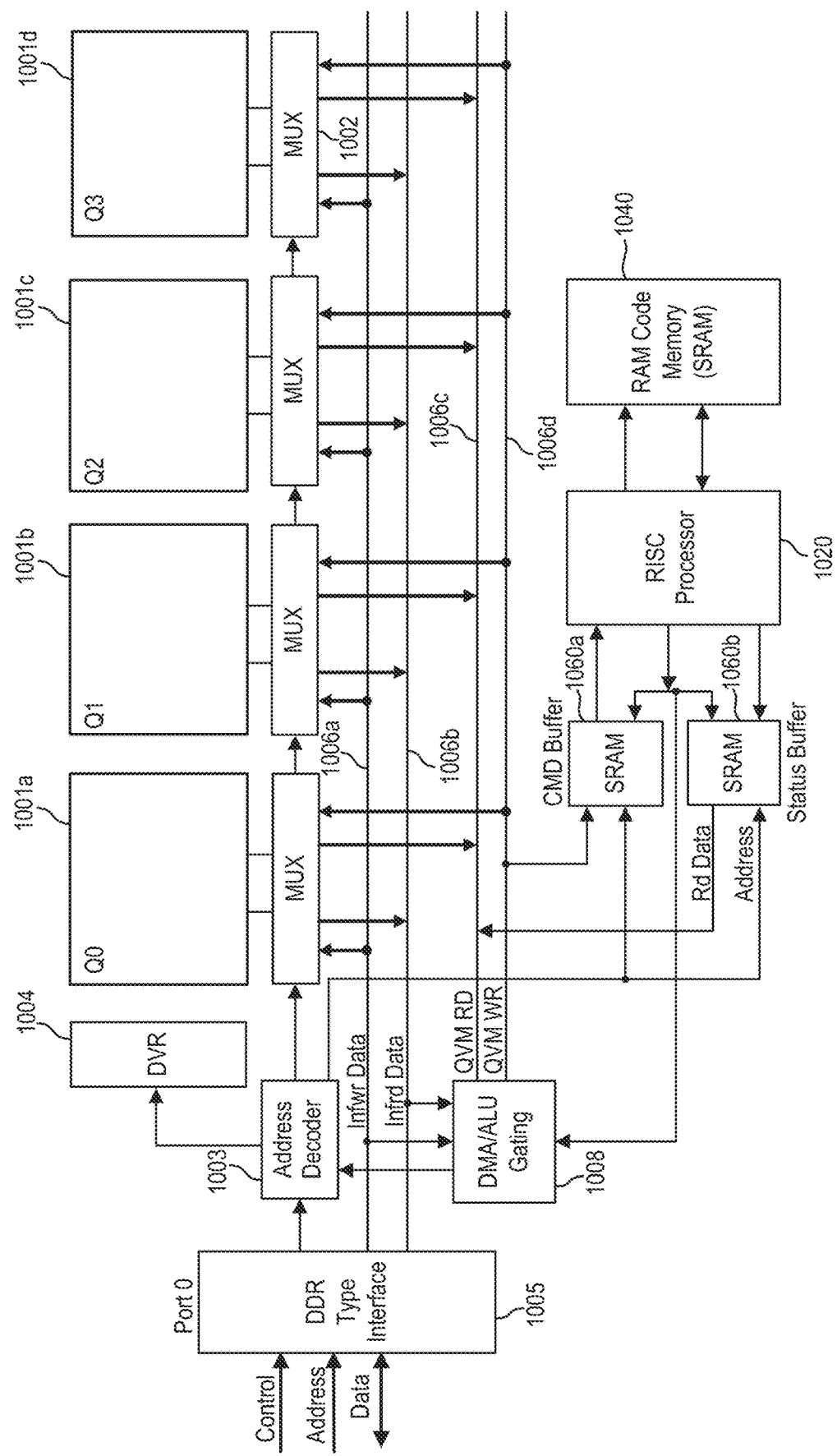
FIG. 21 illustrates a circuit schematic of the computational memory of FIG. 20 in embodiments of the present disclosure.

FIG. 21 illustrates a circuit schematic of the computational memory of FIG. 20 in embodiments of the present disclosure. In particular, FIG. 21 illustrates a computational memory circuit 1000 for handling read and write operations with a QV memory that includes partition units 1001a-1001d each provided in a memory die of a QV memory module, according to embodiments of the present disclosure. Referring to FIG. 21, the partition units 1001a-1001d may each consist of one or more tiles (e.g., a single tile, a tile row, a bank or a bank group) in a memory die. In the present example, four partition units are shown for illustrative purpose only. Any suitable number of partition units may be used in other embodiments. The memory circuit 1000 includes a RISC processor 1020 in communication with a RAM code memory 1040, which can be a SRAM. The memory circuit 1000 further includes command buffers 1060*a*, 1060*b*, which can also be SRAMs. The command buffer 1060*a* receives write data and provides the write data to RISC processor for execution. The command buffer 1060*b* provides read data generated by the RISC processor.

During a read operation, data and control signals are communicated over memory interface circuit 1005 using read bus 1006*a*. Similarly, during a write operation, data and control signals are communicated over memory interface circuit 1005 using write bus 1006*b*. The memory interface circuit 1005 may be a DDR type memory interface receiving control and address from the host processor and exchanging read and write data with the host processor. Memory circuit 1000 also handles a DMA operation in which a host processor requests copying data between locations in one range of memory addresses to locations in another range of memory addresses. (As known to those of ordinary skill in the art, locations in one of the memory address ranges may correspond to a memory-mapped peripheral device.) Arithmetic-logic circuit 1008 carries out the requested memory operations of memory control circuit 1000, receiving input data signals from partition units 1001*a*-1001*d* on bus 1006*d* and providing output data signals on bus 1006*d* to be written back to partition units 1001*a*-1001*d*. Under control by arithmetic-logic circuit 1008, address decoder 1003 decodes each memory address to provide (i) the decoded address (e.g., row and column addresses) to driver circuit 1004 to activate the requisite word lines and bit lines for memory access, and (ii) control signals to multiplexers 1002 to connect the data signals between partition units 1001*a*-1001*d* and the selected one of buses 1006*a*-606*c*.

The RISC processor 1020 is incorporated into the memory control circuit 1000 to carry out high-level operational tasks for the memory module. As thus configured, a wide range of functionalities and hardware enhancement may be incorporated into the memory control circuit to realize a computational memory.

Figure 22:
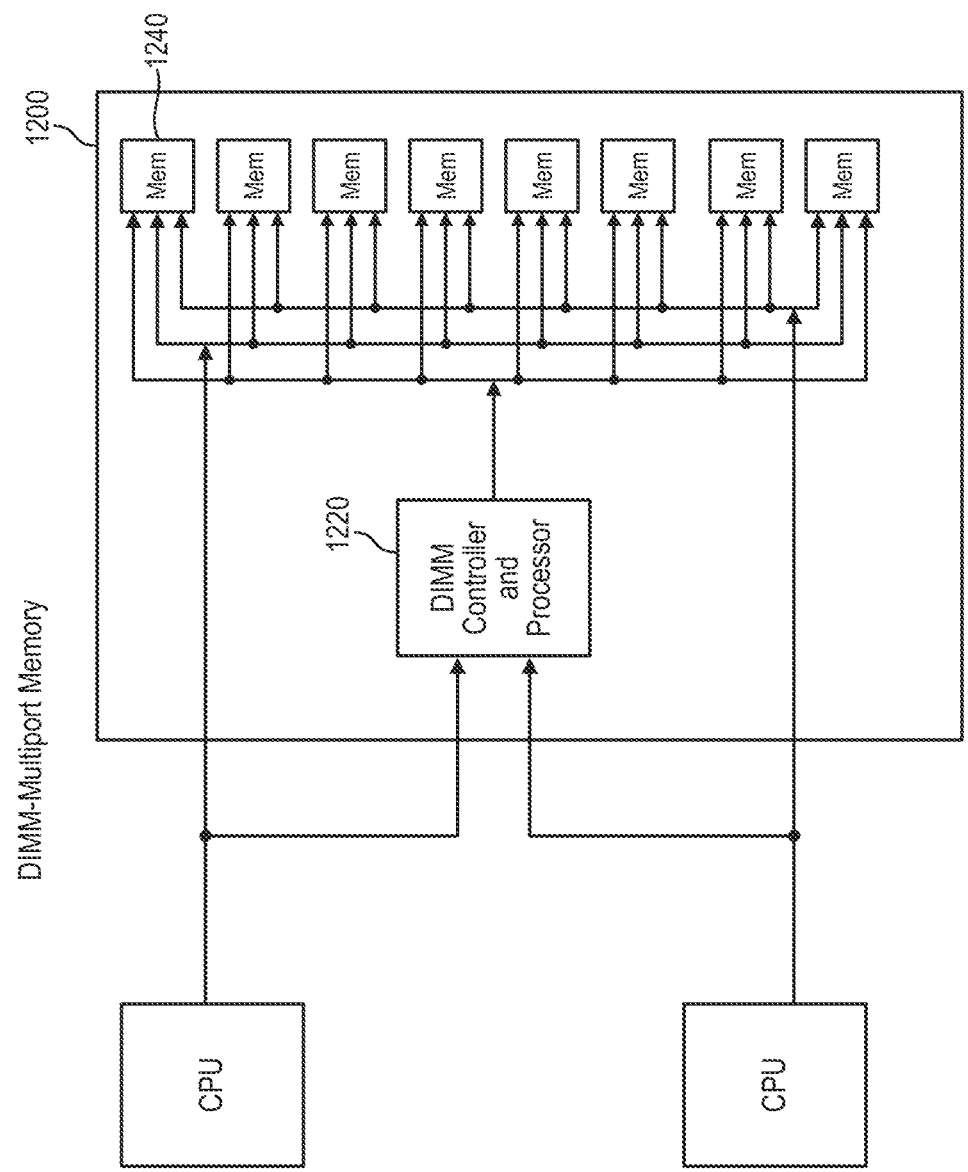
FIG. 22 illustrates an application of the memory module as a smart DIMM multiport memory in embodiments of the present disclosure.

FIG. 22 illustrates an application of the memory module as a smart DIMM multiport memory in embodiments of the present disclosure. Referring to FIG. 22, a smart DIMM multiport memory 1200 includes two CPU ports to enable share memory access by two processing units (CPUs). The smart DIMM multiport memory 1200 includes a DIMM controller and processor 1220 in communication with an array of memory modules 1240. The memory modules 120 are each implemented as a QV memory module or as partitions of a QV memory module. As thus configured, the DIMM controller 1220 also has access to the memory modules 1240, resulting in a 3-way sharing of the memory arrays. In the configuration of FIG. 22, any of the 3 input ports can issue computational command that can be occurring simultaneously in different banks of the memory. Additionally, the DIMM controller 1220 offers an expansion port for communicating between DIMM to DIMM for data search and movement across DIMMs as well as broad computational computation across multiple DIMMs.

Figure 23:
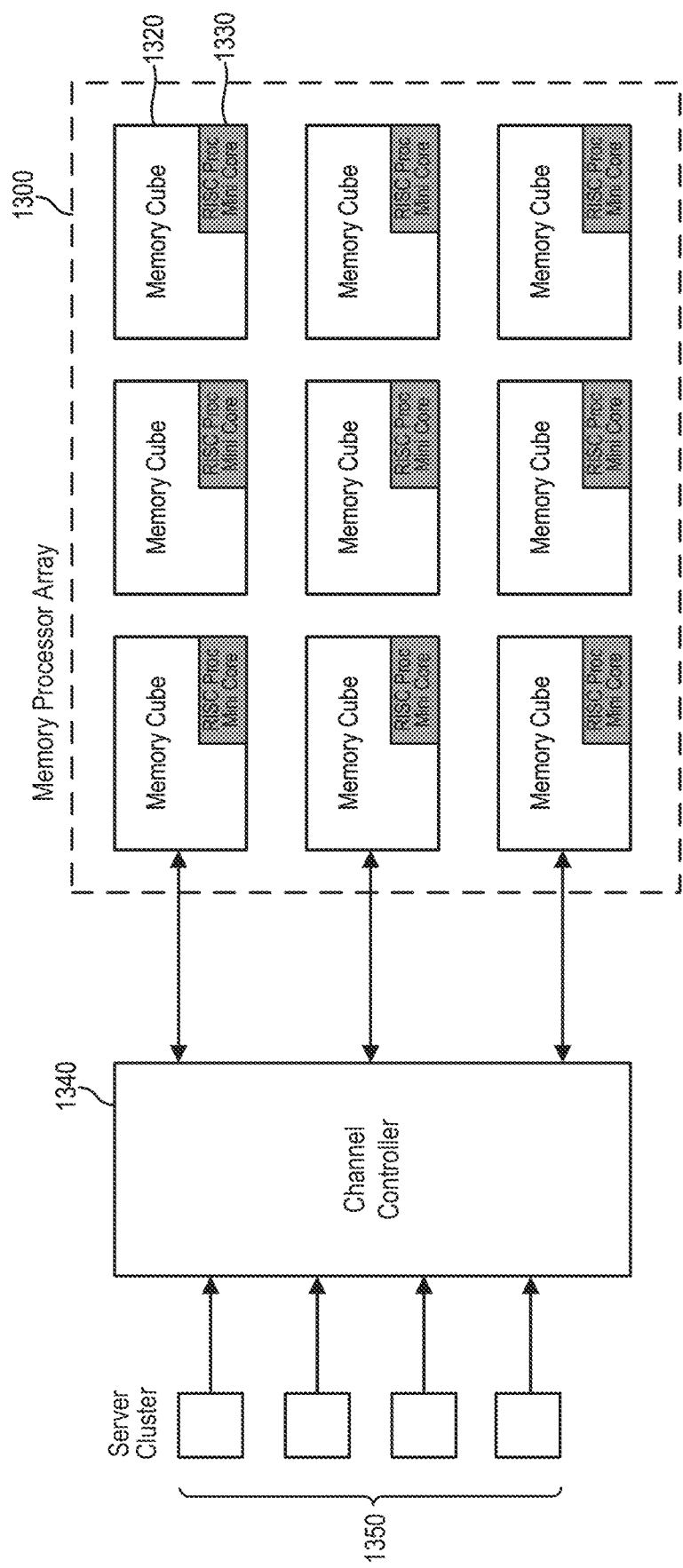
FIG. 23 illustrates a memory processor array implemented using an array of memory cubes in embodiments of the present disclosure.

FIG. 23 illustrates a memory processor array implemented using an array of memory cubes in embodiments of the present disclosure. Referring to FIG. 23, a memory processor array 1300 includes an array of memory cubes 1320 where each memory cube 1320 incorporates a RISC processor mini core to form individual computational memory at each memory cube. In the present illustration, an array of nine memory cubes is shown. In other embodiments, other suitable number of memory cubes may be used to form the memory processor array. Each memory cube 1320 can be constructed as described above, including one or more QV memory dies stacked on a controller die. Each memory cube 1320 is equipped with the RISC processor mini core 1330 to realize in-memory computational capability. As thus configured, the memory processor array 1300 becomes a massive computational engine with parallel compute capability with each RISC processor mini core operating using data stored on the associated memory cube 1320.

The memory processor array 1300 is coupled to a channel controller 1340. A suitable channel controller is described in Provisional Application V. The computational memory system thus formed can be coupled to a server cluster 1350. The servers in the cluster 1350 act as the master job scheduler that manages jobs and locations and the compute configuration itself. Jobs are handed off to the memory cube 1320 with processor for completing the operational task. In this manner, large memory capacity and massively parallel processing can be realized. In one example, the memory processor array 1300 may provide tera bytes of memory and hundreds of processors. With the processor and memory combined into the same hardware with direct and short buses, the computational memory system can realize high performance and very low power as compared to a conventional solution.

In some embodiments, the array of memory cubes 1320 are formed on an interposer and interconnected through conductive traces in or on the interposer.

Figure 24:
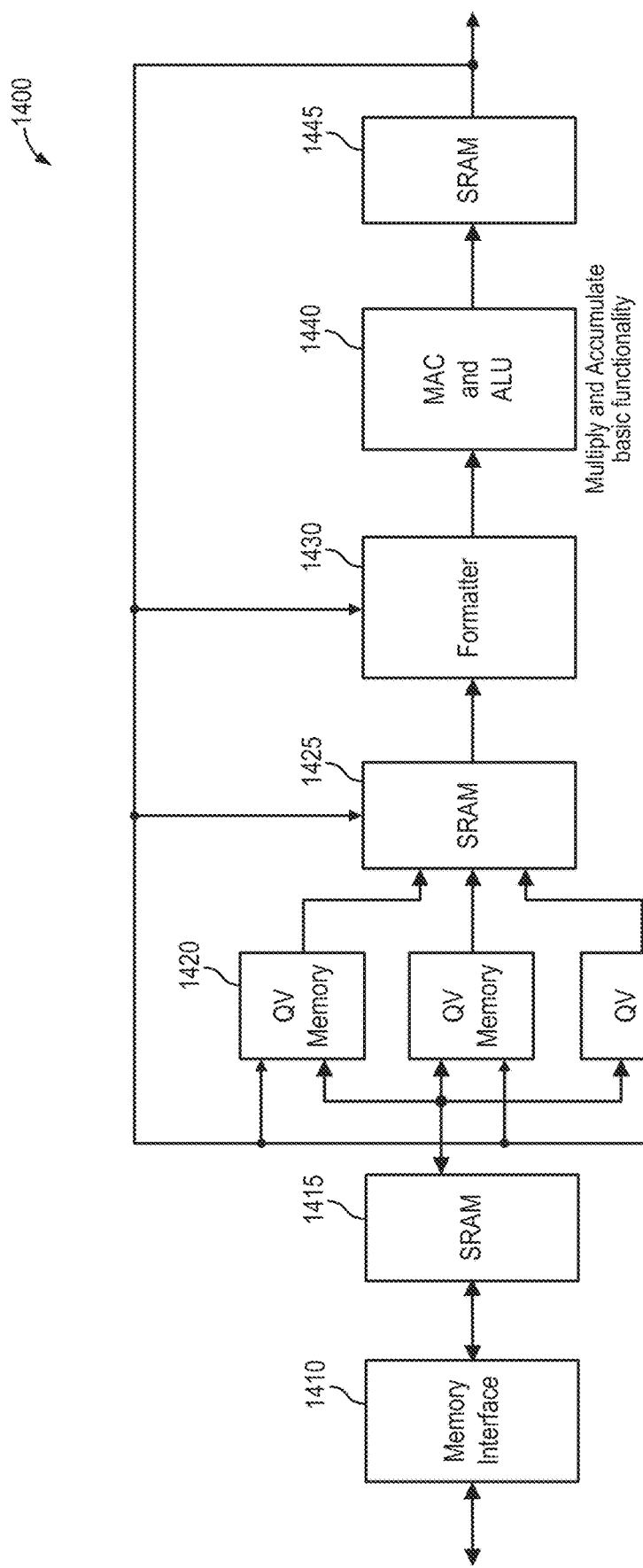
FIG. 24 illustrates an artificial intelligence (AI) computing system incorporating the QV memory module in embodiments of the present disclosure.

FIG. 24 illustrates an artificial intelligence (AI) computing system incorporating the QV memory module in embodiments of the present disclosure. In some embodiments, the AI computing system is built as an ASIC (application-specific integrated circuit) to provide user-defined capabilities. Referring to FIG. 24, an AI computing system 1400 includes a memory interface 1420 for communicating with a host processor, an SRAM 1415 acting as a buffer or cache memory and multiple QV memory modules 1420. In the present example, three QV memory modules are used and they are rotated for speed control. For example, one QV memory module is used for reading, one being used for writing and one being used for erasing to allow the QV memory modules 1420 to keep up with the throughput of data. The AI computing system 1400 further implements arithmetic functions, such as multiply and accumulate functionality through Formatter 1430 and MAC and ALU block 1440. Additional buffer memories (SRAMs 1425 and 1445) are provided to store intermediate processed data. The output of the AI computing system 1400 can be provided to another AI processing unit or provided to the output stage of the QVM and SRM 1425 for additional processing.

In some embodiments, the formatter 1430 and the MAC and ALU block 1440 can be integrated onto the memory controller die in the QV memory modules. In that case, the basic building block 1400 can be built with just 2 semiconductor dies. In other cases, the formatter 1430 and the MAC and ALU block 1440 may be built in a separate semiconductor die.

The AI computing system 1400 represents a basic building block of an AI system. The basic building block can be duplicated to form stages in width or in depth to build the desired AI system. In this manner, large AI systems can be built where the closed memory structure can minimize power consumption. The QV memory refresh cycles can be turned off when the processors are running at high throughput. In some embodiments, the QV memory with the weighted values will have refresh cycles maintained.

Figure 25:
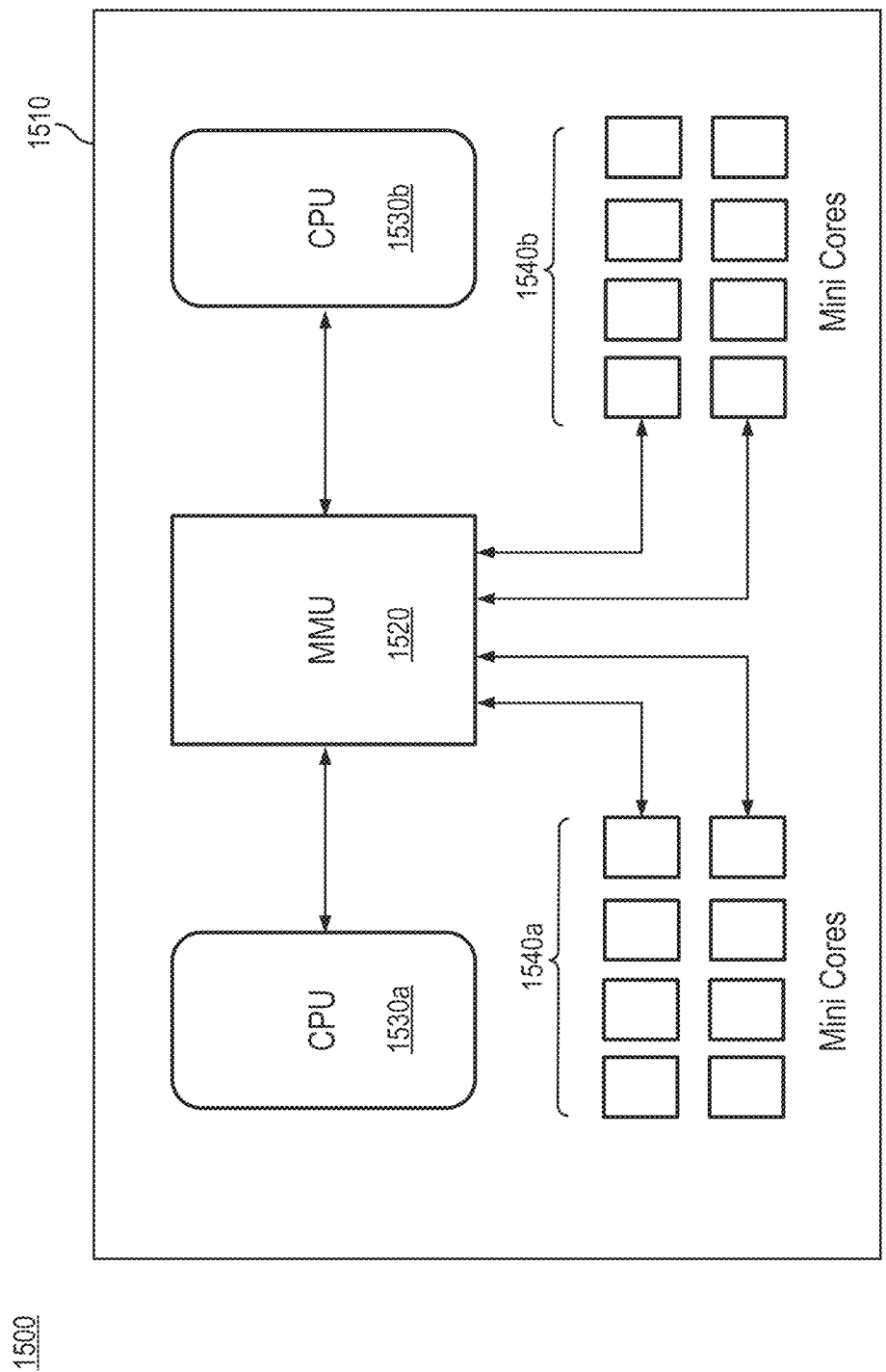
FIG. 25 illustrates a computing system in some examples.

The trends in CPU usage and configuration in modern-day computing systems include using a matrix of processor cores interconnected by a bus matrix on interposer boards. FIG. 25 illustrates a computing system in some examples. Referring to FIG. 25, a computing system 1500 is constructed using one or more big CPU cores 1530, such as CPU 1530*a*, 1530*b*, with a group of mini processor cores 1540, such as mini cores 1540*a*, 1540*b*. The mini processor cores are also referred to as "mini cores". The smaller mini cores 1540 function as low power accelerators running independent tasks from the main CPU cores 1530. The main CPU cores 1530*a*, 1530*b* and the mini processor cores 1540*a*, 1540*b* communicate with a memory management unit (MMU) 1520 to transfer data for execution. In some examples, the CPUs, mini cores, and the MMU are formed on an interposer 1510.

In embodiments of the present disclosure, a memory architecture that can meet the needs of the computing system 1500 is described. More specifically, the memory architecture provides a high speed, large capacity memory for big main CPU processors and smaller fast memories for the smaller mini processor cores. Mini processor cores consume much reduced power but have high compute capability. Data can be moved to the smaller faster memories associated with the mini processor cores for execution. A matrix of interconnects is provided for memory sharing among the mini processor cores. In some examples, the interconnect matrix includes fast and short connects between the mini cores and the small memories. In some embodiments, the mini cores is SRAM like with DMA capability. A RISC processor may be provided to manage the memory using meta data type. The RISC processor may share the schedular with the main CPUs.

In some embodiments, the memory integrated circuit and the processor cores are all attached on an interposer board.

Figure 26:
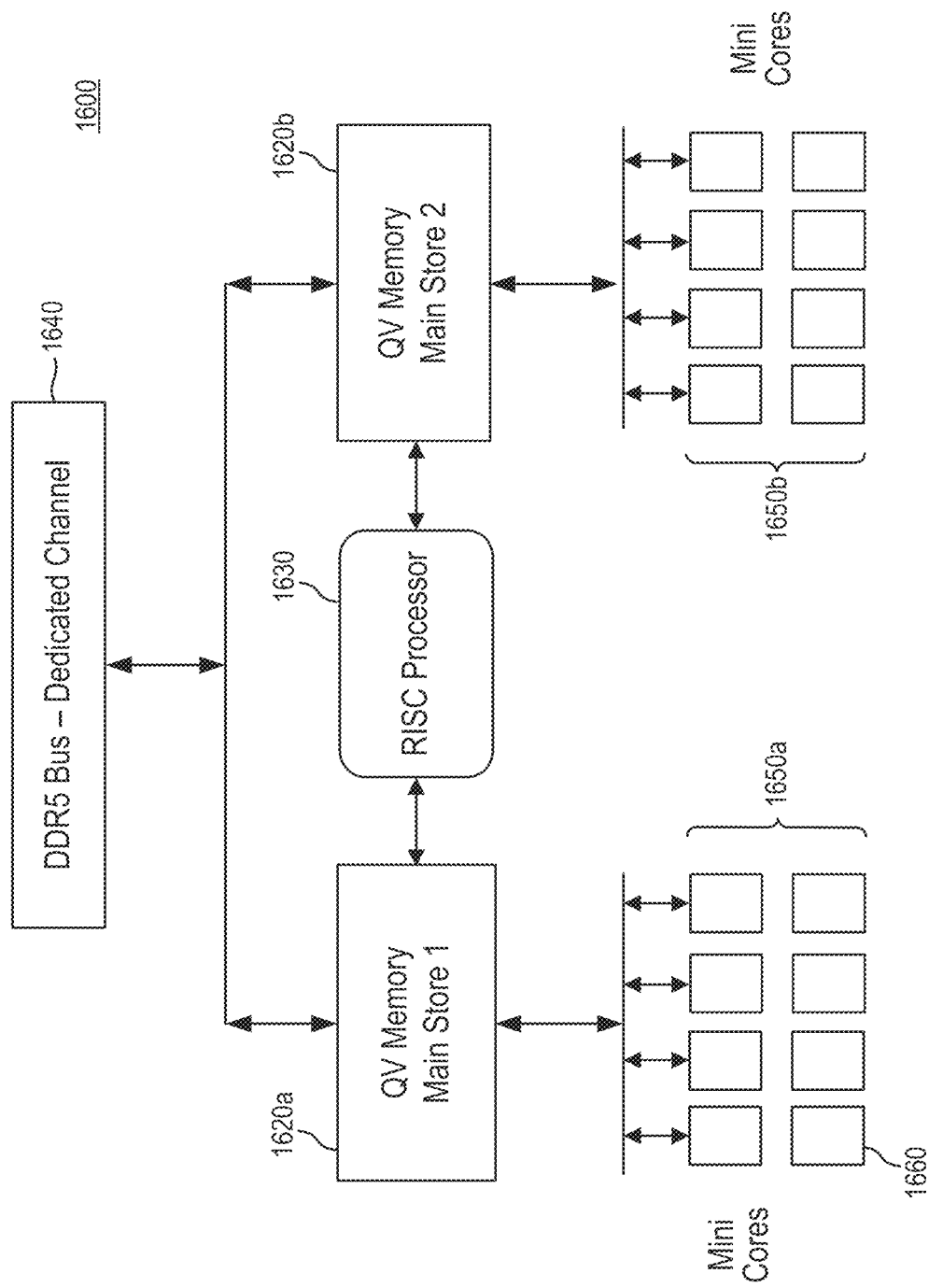
FIG. 26 illustrates a mini core memory system that can be implemented in a computing system utilizing mini processor cores in embodiments of the present disclosure.

FIG. 26 illustrates a mini core memory system that can be implemented in a computing system utilizing mini processor cores in embodiments of the present disclosure. Referring to FIG. 26, a mini core memory system 1600 implements a memory architecture suitable for supporting a mini processing core array in a computing system. The mini core memory system 1600 includes one or more QV memory modules 1620 coupled to an array 1650 of mini processor cores 1660, also referred to as "mini core array". The QV memory module 1620 may be constructed as described above to include a memory die having a QV memory array fabricated thereon attached to a memory controller die, such as by flip chip bonding or hybrid bonding. The QV memory modules 1620 stores memory data that feeds the array of mini processor cores 1650. In some embodiments, each QV memory module 1620 is accessible by the associated array of mini processor cores directly and in parallel. In the present example, two QV memory modules 1620*a*, 1620*b* are provided, each supporting respective mini processor core array 1650*a*, 1650*b*.

The memory system 1600 includes a RISC processor 1630 to manage data movement to the mini cores 1650. The RISC processor 1630 is in communication with the CPU schedular to receive packets of data that define which processor core 1660 will get what data and moves data accordingly. In some embodiments, the RISC processor 1630 has meta data type information. The memory system 1600 further includes a memory interface 1640 connected to the one or more QV memory modules 1620 and for communication with a host processor. In the present embodiment, the memory interface 1640

As thus configured, the mini core memory system 1600 provides a memory that can be accessed directly and in parallel by the processor cores, which can enhance the performance of the computing system. In some embodiments, the mini core memory system 1600 uses a QV memory module with associated SRAM memories and may use a modified SRAM interface for connecting the QV memory module to the mini processor cores. The interface may use a page mode control that allows for high order address loads. In the page mode, the memory is addressed by the address bus unless the Page bit is active that allows the upper address bits to be loaded. In another embodiment, the interface may also use a DMA mode where no address buses are used. The memory fetches sequential data. When a branch occurs, an Exit DMA line occurs, which activates the addresses and fetches the new data at the jump address. The memory then lowers the Exit DMA and revert back to sequential mode staring from the jump address. The DMA mode removes the address lines for most operations, thereby saving power. As data is sequential, a pipelined approach can be taken for very fast data movement. When not in DMA and normal memory operation is occurring, extra clock cycles will be added. The SRAM memories function as a cache.

In some embodiments, the memory manager will store the mini core programs in the QV memory modules 1620. The host processor will send packets of information to the RISC processor 1630 that tells it which core to use and what address its code is located. The RISC processor 1630 will then move that data into the appropriate SRAM matching the core location. The RISC processor 1630 then activates the processor core 1660 and monitors the core for completion. At the end of the execution, a program status is returned to the operating system. The initial command passed to the core 1660 usually instructs the core where to put output data or results which the RISC processor can manage. By managing memory in this manner, the overhead of the host processor (main CPU) is reduced.

Figure 27:
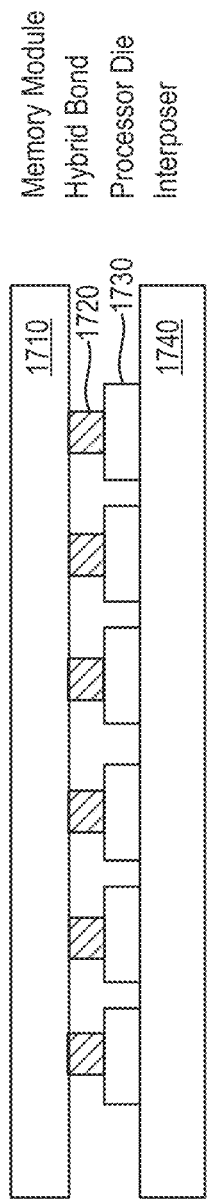
FIG. 27 illustrates a semiconductor package which can be used to construct the mini core memory system in embodiments of the present disclosure.

FIG. 27 illustrates a semiconductor package which can be used to construct the mini core memory system in embodiments of the present disclosure. Referring to FIG. 27, a mini core memory package 1700 includes a QV memory module 1710 connected to an array of mini processor cores 1730 through hybrid bonds 1720. The mini processor cores 1730 are individual semiconductor dies formed on an interposer 1740. The direct connection between the QV memory and the mini processor core realizes low power and ultra-high speed operation, resulting in high performance while consuming low power.

Figure 28:
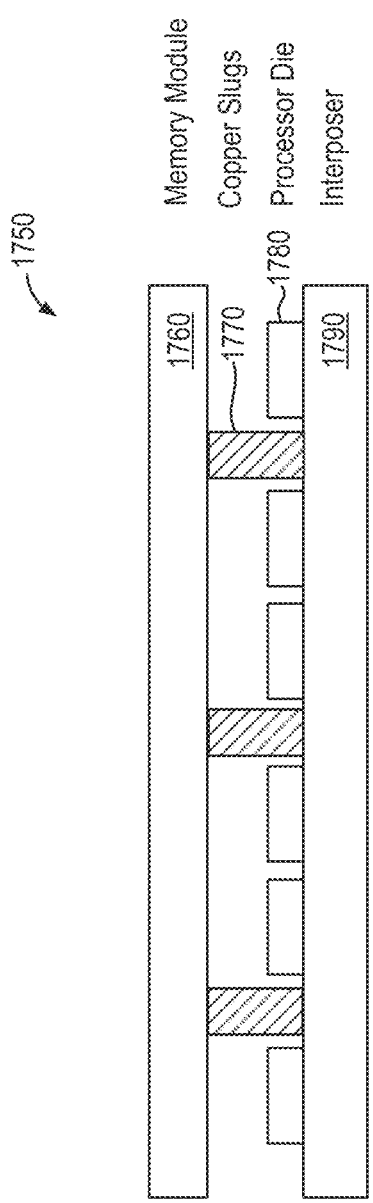
FIG. 28 illustrates a semiconductor package which can be used to construct the mini core memory system in alternate embodiments of the present disclosure.

FIG. 28 illustrates a semiconductor package which can be used to construct the mini core memory system in alternate embodiments of the present disclosure. Referring to FIG. 28, a mini core memory package 1750 includes a QV memory module 1760 connected to an interposer 1790 through an array of metal interconnects 1770, such as copper slugs in one embodiment. Individual semiconductor dies of an array of mini processor cores 1780 are formed on the interposer 1790. Conductive traces formed on or in the interposer 1790 connects the mini processor cores 1780 to the QV memory module 1760 (through the metal interconnects 1770). In this embodiment, the QV memory module 1760 is connected to the interposer instead of to the individual processor core semiconductor dies. The packaging process therefore can tolerate variation in the height of the processor core semiconductor dies.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

What is claimed is:

1. A memory device comprising:
    a memory module comprising one or more quasi-volatile memory circuits interconnected to at least one memory controller circuit, the memory module comprising a plurality of memory ports; and
    a plurality of multi-port memories coupled to the memory module at the plurality of memory ports, each multi-port memory being coupled to one memory port in the plurality of memory ports to exchange data with the memory module, each multi-port memory further comprising a plurality of memory interfaces for connecting to respective memory channels, wherein each multi-port memory comprises one or more quasi-volatile memory circuits interconnected to at least one memory controller circuit.

2. The memory device of claim 1, wherein each multi-port memory of the plurality of multi-port memories further comprises a SRAM circuit for storing memory data being exchanged on the plurality of memory interfaces.

3. The memory device of claim 1, wherein the memory module and the plurality of multi-port memories are formed on an interposer and interconnected through conductive traces on or in the interposer.

4. The memory device of claim 1, wherein the memory module comprises the one or more quasi-volatile memory circuits each formed on a separate semiconductor substrate and interconnected with each other, and the at least one memory controller circuit also formed on a semiconductor substrate separate from the semiconductor substrates of the quasi-volatile memory circuits and interconnected to one of the quasi-volatile memory circuits, and wherein the at least one memory controller circuit operates the quasi-volatile memory circuits as one or more quasi-volatile memories.

5. The memory device of claim 4, wherein the one or more quasi-volatile memory circuits on separate semiconductor substrates are formed as stacked semiconductor dies and interconnected with each other by through-silicon vias formed in the semiconductor substrates, and wherein the memory controller circuit is interconnected to one of the quasi-volatile memory circuits through hybrid bonds.

6. The memory device of claim 4, wherein the one or more quasi-volatile memory circuits on separate semiconductor substrates are formed as a first set of stacked semiconductor dies and a second set of stacked semiconductor dies, the quasi-volatile memory circuits in each of the first set and the second set being interconnected with each other by through-silicon vias formed in the respective semiconductor substrates, and wherein the memory module comprises a first memory controller circuit interconnected to one of the quasi-volatile memory circuits in the first set of stacked semiconductor dies and a second memory controller circuit interconnected to one of the quasi-volatile memory circuits in the second set of stacked semiconductor dies,
    wherein the first set of stacked semiconductor dies with the first memory controller circuit is formed stacked on the second set of stacked semiconductor dies with the second memory controller circuit, the first memory controller circuit and the second memory controller circuit being interconnected through a connector channel compromising through-silicon vias.

7. The memory device of claim 1, wherein each multi-port memory of the plurality of multi-port memory comprises the one or more quasi-volatile memory circuits each formed on a separate semiconductor substrate and interconnected with each other by through-silicon vias formed in the semiconductor substrates, and the at least one memory controller circuit also formed on a semiconductor substrate separate from the semiconductor substrates of the quasi-volatile memory circuits, wherein the memory controller circuit is interconnected to one of the quasi-volatile memory circuits through hybrid bonds and wherein the memory controller circuit operates the quasi-volatile memory circuits as one or more quasi-volatile memories.

8. The memory device of claim 1, wherein each quasi-volatile memory circuit of each multi-port memory comprises a memory cell array divided into partitions, the partitions being accessible through the plurality of memory interfaces.

9. The memory device of claim 1, wherein each of the memory ports of the memory module connects to a respective multi-port memory through a high capacity data bus.

10. A memory device, comprising:
    a high density memory module comprising an array of quasi-volatile memory modules, each quasi-volatile memory module comprising one or more quasi-volatile memory circuits interconnected to at least one memory controller circuit, the high density memory module further comprising a plurality of memory ports; and
    a channel controller coupled to the plurality of memory ports of the high density memory module to access the array of quasi-volatile memory modules.

11. The memory device of claim 10, wherein the array of quasi-volatile memory modules are formed on an interposer and connected to the plurality of memory ports through conductive traces on or in the interposer.

12. The memory device of claim 10, wherein each of the quasi-volatile memory modules comprises the one or more quasi-volatile memory circuits each formed on a separate semiconductor substrate and interconnected with each other, and the at least one memory controller circuit also formed on a semiconductor substrate separate from the semiconductor substrates of the quasi-volatile memory circuits and interconnected to one of the quasi-volatile memory circuits, and wherein the at least one memory controller circuit operates the quasi-volatile memory circuits as one or more quasi-volatile memories.

13. The memory device of claim 12, wherein the one or more quasi-volatile memory circuits on separate semiconductor substrates are formed as stacked semiconductor dies and interconnected with each other by through-silicon vias formed in the semiconductor substrates, and wherein the memory controller circuit is interconnected to one of the quasi-volatile memory circuits through hybrid bonds.

14. The memory device of claim 10, wherein the channel controller comprises:
a plurality of host interface circuits each configured to receive from one or more host processors memory access requests to the high density memory module;
a priority circuit which prioritizes the memory access requests to avoid a memory access conflict and which designates each prioritized memory access request to one of the memory ports for carrying out the memory access specified in that prioritized request;
a switch circuit; and
a plurality of memory interface circuits, each coupled to an associated one of the memory ports, wherein the switching circuit routes to each memory interface circuit the prioritized memory access requests designated for its associated memory port.

15. The memory device of claim 10, wherein the plurality of memory ports of the high density memory module carry out memory accesses in parallel.

16. The memory device of claim 10, wherein each quasi-volatile memory module in the high density memory module further comprises a mini processor core, wherein the array of quasi-volatile memory modules forming a parallel computation engine where each mini processor core executes processing tasks using data stored on the associated quasi-volatile memory module.

17. A mini processor core memory module, comprising:
a first semiconductor substrate comprising a plurality of quasi-volatile memory circuits formed thereon, the plurality of quasi-volatile memory circuits being divided into memory partitions; and
a second semiconductor substrate comprising a memory controller circuit to operate the quasi-volatile memory circuits as one or more quasi-volatile memories, a plurality of SRAM circuits associated with each memory partitions, and an array of mini processor cores, the second semiconductor substrate being connected to the first semiconductor substrate, wherein the array of mini processor cores accesses the memory partitions of the plurality of quasi-volatile memory circuits in parallel.

18. The memory module of claim 17, wherein the array of mini processor cores executes processing tasks in parallel using data provided by the memory partitions of the plurality of quasi-volatile memory circuits.

19. The memory module of claim 18, wherein the array of mini processor cores accesses the memory partitions of the plurality of quasi-volatile memory circuits in parallel through the respective SRAM circuits.

20. The memory module of claim 17, wherein the memory controller circuit comprises a memory interface circuit configured to communicate with a host processor.

21. The memory module of claim 17, wherein the mini processor cores accesses the memory partitions of the plurality of quasi-volatile memory circuits using direct memory access.

22. A computational memory module, comprising:
a first semiconductor substrate comprising a plurality of quasi-volatile memory circuits formed thereon, the plurality of quasi-volatile memory circuits being divided into memory partitions; and
a second semiconductor substrate comprising a memory controller circuit to operate the quasi-volatile memory circuits as one or more quasi-volatile memories, a plurality of SRAM circuits associated with each memory partitions, a processor, a code memory, and a memory access circuit, the second semiconductor substrate being connected to the first semiconductor substrate, wherein the processor accesses the memory partitions of the plurality of quasi-volatile memory circuits using the memory access circuit to exchange data in response to executing processing tasks.

23. The computational memory module of claim 22, wherein the memory access circuit comprises a DMA logic circuit and the processor accesses the memory partitions of the plurality of quasi-volatile memory circuits using direct memory access.

24. The computational memory module of claim 22, wherein the second semiconductor substrate further comprises a first command buffer for storing write data to the quasi-volatile memory circuits and providing the write data to the processor the and a second command data for providing read data generated by the processor.

25. The computational memory module of claim 22, wherein the second semiconductor substrate further comprises a first command buffer for storing write data to the quasi-volatile memory circuits and providing the write data to the processor the and a second command data for providing read data generated by the processor.

26. The computational memory module of claim 22, where in the processor comprises a RISC processor.

27. A memory system for mini processor cores, comprising:
an array of mini processor cores;
a quasi-volatile memory module coupled to the array of mini processor cores, wherein the mini processor cores in the array directly access the quasi-volatile memory module, the quasi-volatile memory module being accessible by the array of mini processor cores in parallel; and
a processor in communication with the quasi-volatile memory module to manage data movement to the array of mini processor cores.

28. The memory system of claim 27, where in the processor comprises a RISC processor.

29. The memory system of claim 27, further comprising a memory interface coupled to the quasi-volatile memory module to communicate with a host processor.

30. The memory system of claim 27, wherein the array of mini processor cores are formed on an interposer and the quasi-volatile memory module is coupled to the array of mini processor cores through hybrid bonds.

31. The memory system of claim 27, wherein the array of mini processor cores are formed on an interposer and the quasi-volatile memory module is connected to the interposer through metal interconnects, the quasi-volatile memory module connecting to the array of mini processor cores through conductive traces formed on or in the interposer.

32. The memory system of claim 31, wherein the metal interconnects comprises copper slugs.

* * * * *